United States Patent
Tanida et al.

(10) Patent No.: US 8,089,163 B2
(45) Date of Patent: Jan. 3, 2012

(54) SEMICONDUCTOR DEVICE PRODUCTION METHOD AND SEMICONDUCTOR DEVICE

(75) Inventors: Kazumasa Tanida, Kyoto (JP); Yoshihiko Nemoto, Tokyo (JP); Mitsuo Umemoto, Ibaraki (JP)

(73) Assignees: Rohm Co., Ltd., Kyoto (JP); Renesas Technology Corporation, Tokyo (JP); Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/396,797

(22) Filed: Apr. 4, 2006

(65) Prior Publication Data

US 2006/0194367 A1 Aug. 31, 2006

Related U.S. Application Data

(62) Division of application No. 10/704,608, filed on Nov. 12, 2003.

(30) Foreign Application Priority Data

Nov. 21, 2002 (JP) .................................. 2002-338480

(51) Int. Cl.
*H01L 23/48* (2006.01)
(52) U.S. Cl. .................. 257/775; 257/E23.021
(58) Field of Classification Search .................. 257/686, 257/778, 787, 678, 738, 779, 777, 775, 676, 257/E23.015, E23.021
See application file for complete search history.

(56) References Cited

U.S. PATENT DOCUMENTS

| 6,274,499 B1 | 8/2001 | Gupta et al. |
| 6,413,404 B1 | 7/2002 | Ihara et al. |
| 6,803,304 B2 * | 10/2004 | Asami ........................ 438/613 |
| 2002/0105094 A1 * | 8/2002 | Sahara et al. ............... 257/778 |

FOREIGN PATENT DOCUMENTS

| CN | 1306300 A | 8/2001 |
| CN | 2003-101164439 | 8/2007 |
| JP | 01-251642 | 6/1989 |
| JP | 07-045662 | 2/1995 |
| JP | 10-275811 | 10/1998 |
| JP | 11-026466 | 1/1999 |
| JP | 11-284005 | 10/1999 |
| JP | 2000-294585 | 10/2000 |
| JP | 2000-340592 | 12/2000 |
| JP | 2001-196407 | 7/2001 |
| JP | 2001-223232 | 8/2001 |
| JP | 2002-299361 | 10/2002 |

* cited by examiner

*Primary Examiner* — Hoa B Trinh
(74) *Attorney, Agent, or Firm* — Rabin & Berdo, P.C.

(57) ABSTRACT

A semiconductor device production method including: the step of forming a stopper mask layer of a first metal on a semiconductor substrate, the stopper mask layer having an opening at a predetermined position thereof; the metal supplying step of supplying a second metal into the opening of the stopper mask layer to form a projection electrode of the second metal; and removing the stopper mask layer after the metal supplying step.

15 Claims, 28 Drawing Sheets

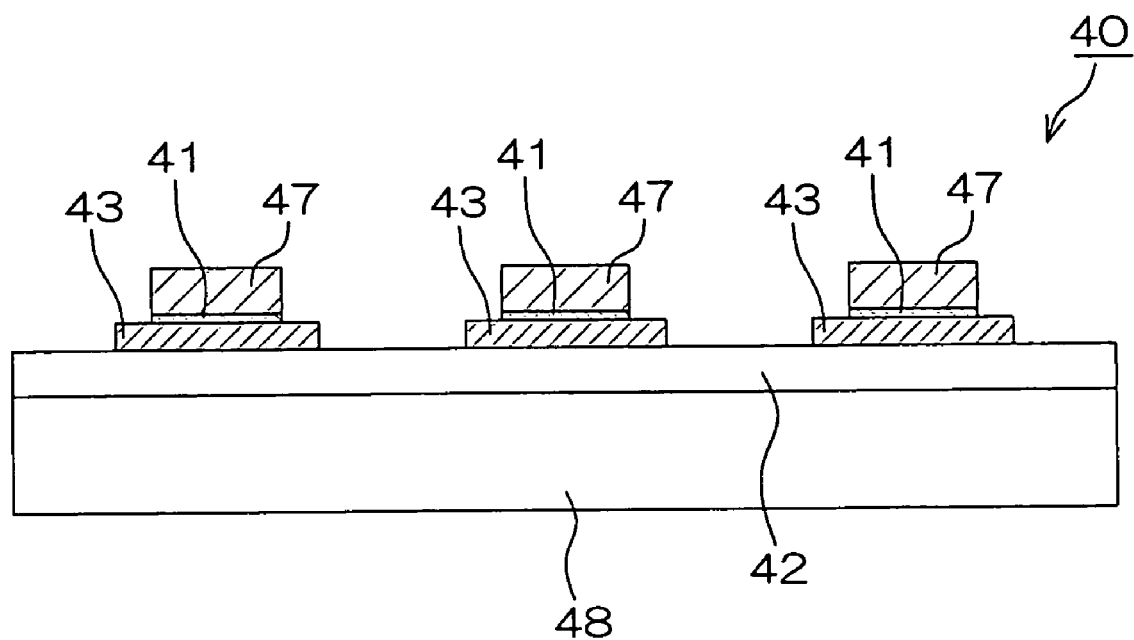

and SEMICONDUCTOR DEVICE PRODUCTION METHOD AND SEMICONDUCTOR DEVICE

This is a Divisional of U.S. application Ser. No. 10/704,608, filed Nov. 12, 2003, the subject matter of which is incorporated herein by reference.

BACKGROUND OF THE INVENTION

1. Field of the Invention

The present invention relates to a semiconductor device production method and a semiconductor device. Particularly, the invention relates to a semiconductor device having electrodes arranged at a reduced pitch on a semiconductor substrate and to a production method therefor.

2. Description of Related Art

The semiconductor device mounting technology includes so-called flip-chip connection by which a semiconductor chip is directly connected to a wiring board without packaging thereof. The semiconductor chip for the flip-chip connection includes projection electrodes which are provided on a surface of the chip formed with an active layer including a functional device and interconnections. The projection electrodes are respectively bonded to electrode pads provided on the wiring board to establish the flip-chip connection. In this case, the semiconductor chip per se is a semiconductor device.

FIGS. 26(a), 26(b), 26(c) and 26(d) are schematic sectional views for explaining a production method for a conventional semiconductor device having projection electrodes.

An active layer 102 including a functional device and interconnections is formed in one surface of a semiconductor substrate 101, such as a semiconductor wafer, preliminarily planarized, and electrode pads 103 for electrically connecting the functional device in the active layer to an external device are formed at predetermined positions on the active layer 102.

Subsequently, a passivation film 107 is formed on the semiconductor substrate 101 so as to expose the electrode pads 103. Then, a barrier metal layer (UBM: under bump metal) 104 for protection of the electrode pads 103 and the active layer 102 is formed over the surface of the resulting semiconductor substrate 101 on the side of the active layer 102. This state is shown in FIG. 26(a).

In turn, a resist film (photoresist) 105 is formed on the barrier metal layer 104 as having apertures 105a in association with the electrode pads 103 (see FIG. 26(b)). The apertures 105a each have an interior sidewall generally perpendicular to the semiconductor substrate 101.

Thereafter, projection electrodes 106 are respectively formed in the apertures 105a of the resist film 105 by electrolytic plating. At this time, an electric current is applied to a plating liquid via the barrier metal layer 104. Thus, the barrier metal layer 104 serves as a seed layer, whereby a metal such as copper is deposited on the barrier metal layer 104 to form the projection electrodes 106 (see FIG. 26(c)).

In turn, the resist film 105 is removed. Further, the barrier metal layer 104 is removed with portions thereof between the electrode pads 103 and the projection electrodes 106 being left. Thus, the projection electrodes 106 projecting from the semiconductor substrate are provided. This state is shown in FIG. 26(d).

As required, low melting point metal layers 108 are respectively formed on the projection electrodes 106 as covering at least distal end faces of the projection electrodes 106. Where the low melting point metal layers 108 are formed by electroless plating after the removal of the resist film 105, for example, the low melting point metal layers 108 cover the entire exposed surfaces of the projection electrodes 106 as shown in FIG. 27(e). That is, the low melting point metal layers 108 cover the side faces of the projection electrodes 106 as well.

Alternatively, the formation of the projection electrodes 106 by the electrolytic plating is completed with the apertures 105a partly left unfilled, and then the low melting point metal layers 108 are formed by the electrolytic plating before the removal of the resist film 105 and the barrier metal layer 104. In this case, the low melting point metal layers 108 are provided only in the apertures 105a as shown in FIG. 28(f). Thereafter, the resist film 105 is removed, and the barrier metal layer 104 is removed with the portions thereof between the electrode pads 103 and the projection electrodes 106 being left. Thus, the projection electrodes 106 are provided as having the low melting point metal layers 108 formed only on the distal end faces thereof as shown in FIG. 28(g).

Then, the semiconductor substrate 101 is diced to provide a plurality of semiconductor chips (semiconductor devices) each having projection electrodes 106. Where the projection electrodes 106 are respectively formed with the low melting point metal layers 108, the semiconductor device can easily be bonded to electrode pads of a wiring board by melting and solidifying the low melting point metal layers 108. Such a semiconductor device production method is disclosed, for example, in the following literature: Yoshiaki Yamamoto, "Chisso's Wafer Bumping Service", Densi Zairyo (Electronic Materials and Parts), May, 1995, p. 101-104.

However, the projection electrodes 106 formed by the plating are non-uniform in length (or height as measured from the barrier metal layer 104). The growth rate of the projection electrodes 106 is generally proportional to the amperage of the electric current flowing between the barrier metal layer 104 and the plating liquid. However, the amperage of the electric current flowing between the barrier metal layer 104 and the plating liquid is not uniform throughout the plane of the semiconductor substrate 101 (e.g., between the center and periphery of the semiconductor substrate 101).

If the projection electrodes 106 are non-uniform in length, the distal ends of the projection electrodes 106 are not located within the same plane. When the semiconductor chip formed with the projection electrodes 106 is bonded to the electrode pads and the like formed on the wiring board, some of the projection electrodes 106 having a smaller length cannot properly be brought into contact with the electrode pads of the wiring board. This results in a mechanical bonding failure and an electrical connection failure.

The barrier metal layer 104 serving as a base for the plating has steps due to the presence of the passivation film 107. Therefore, the distal end faces of the projection electrodes 106 each have a recessed center portion as shown in FIGS. 26(c), 26(d), 27(e), 28(f) and 28(g). In such a case, the projection electrodes 106 cannot properly be brought into contact with the electrode pads of the wiring board, resulting in a mechanical bonding failure and an electrical connection failure.

During the plating, the projection electrodes 106 grow as expanding the apertures 105a to deform the resist film 105, whereby the projection electrodes 106 each have a width progressively increased toward the distal end thereof. As a result, the projection electrodes 106 each have an inverted trapezoidal section as shown in FIG. 26(d). Where the adjacent electrode pads 103 are spaced a smaller distance (pitch), the distal ends of the projection electrodes 106 provided on the adjacent electrode pads 103 are located in close relation. Therefore, when the semiconductor device is connected to the wiring board, the adjacent projection electrodes 106 are readily brought into contact with each other thereby to be electrically short-circuited. Therefore, it is impossible to arrange the projection electrodes 106 (electrode pads 103) in closer relation, i.e., to reduce the pitch of the projection electrodes 106.

Since limited kinds of metals are usable for the film formation by the plating, there is a limited choice of materials for the projection electrodes 106.

Where the low melting point metal layers 108 are formed by the electroless plating after the removal of the resist film 105, the low melting point metal layers 108 are formed on not only the distal ends but also the side faces of the projection electrodes 106. Since the semiconductor device for the flip-chip connection is connected to the external device via the distal ends of the projection electrodes 106, portions of the low melting point metal layers 108 except those formed on the distal end faces of the projection electrodes 106 are not contributable to the connection, but may cause a short-circuit between the adjacent projection electrodes 106.

Where the low melting point metal layers 108 are formed by the electrolytic plating, the low melting point metal layers 108 are non-uniform in thickness within the plane of the semiconductor substrate 101, like the projection electrodes 106. Therefore, the distal end faces of the projection electrodes 106 including the low melting point metal layer 108 are not located within the same plane, resulting in a bonding failure.

After the projection electrodes 106 are formed by the electrolytic plating, the barrier metal layer 104 is removed by wet etching. However, it is difficult to control the etching amount at this time. Therefore, portions of the barrier metal layer 104 present between the projection electrodes 106 and the passivation film 107 and between the projection electrodes 106 and the electrode pads 103 may partly be removed (over-etched). This results in reduction of the bonding strength of the projection electrodes 106 to the electrode pads 103. Where the portions of the barrier metal layer 104 between the electrode pads 103 and the projection electrodes 106 are etched, the electrode pads 103 are partly exposed (or uncovered). This leads to corrosion of the electrode pads 103, thereby reducing the reliability of the semiconductor device.

SUMMARY OF THE INVENTION

It is an object of the present invention to provide a production method for a semiconductor device which includes a plurality of projection electrodes having distal end faces located within the same plane.

It is another object of the present invention to provide a semiconductor device production method, wherein the reduction of the pitch of projection electrodes is possible.

It is further another object of the present invention to provide a semiconductor device production method which has a wide choice of metal materials for projection electrodes.

It is still another object of the present invention to provide a semiconductor device production method which ensures that low melting point metal layers each having a generally even thickness are formed only on distal end faces of projection electrodes.

It is further another object of the present invention to provide a semiconductor device which includes a plurality of projection electrodes having distal end faces located within the same plane.

It is still another object of the present invention to provide a semiconductor device which includes projection electrodes arranged at a reduced pitch.

It is further another object of the present invention to provide a semiconductor device which has a wide choice of metal materials for projection electrodes.

It is still another object of the present invention to provide a semiconductor device, wherein low melting point metal layers each having an even thickness are provided only on distal end faces of projection electrodes.

According to a first aspect of the present invention, there is provided a semiconductor device production method, which comprises: the stopper mask formation step of forming a stopper mask layer of a first metal on a semiconductor substrate, the stopper mask layer having an opening at a predetermined position thereof; the metal supplying step of supplying a second metal into the opening of the stopper mask layer to form a projection electrode of the second metal; and the step of removing the stopper mask layer after the metal supplying step.

According to this inventive aspect, the stopper mask layer of the first metal is less liable to be deformed than the resist film (photoresist) employed in the conventional production method when a force is exerted thereon. Therefore, the stopper mask layer is hardly deformed when the second metal is supplied into the opening of the stopper mask layer in the metal supplying step. Therefore, the shape of a portion of the second metal present in the opening of the stopper mask layer, i.e., the shape of the projection electrode, conforms to the initial shape of the opening.

Even if the projection electrode formation step accompanies a polishing process, the stopper mask layer is less liable to be deformed when a force is exerted thereon in this step. Hence, the shape of the projection electrode conforms to the initial shape of the opening.

Therefore, where the opening has an interior side wall generally perpendicular to the semiconductor substrate, the projection electrode has side faces generally perpendicular to the semiconductor substrate and a generally uniform width (the projection electrodes do not overhang along the surface of the semiconductor substrate). That is, there is no possibility that the projection electrode has a width progressively increased toward the distal end face thereof during the growth of the projection electrode as in the conventional production method. Hence, distal ends of adjacent projection electrodes are hardly brought into contact with each other to be electrically short-circuited, so that the projection electrodes can be arranged in close relation. That is, the pitch of the projection electrodes can be reduced.

Since the stopper mask layer is removed after the formation of the projection electrodes, there is no possibility that the projection electrodes are electrically short-circuited via the stopper mask layer in the resulting semiconductor device.

As described above, the stopper mask layer is preferably less liable to be deformed. For example, the stopper mask layer may be formed of a harder metal than the projection electrode. Where the projection electrode is formed of copper, for example, the stopper mask layer may be formed of chromium (Cr).

According to a second aspect of the present invention, there is provided a semiconductor device production method, which comprises: the stopper mask formation step of forming a stopper mask layer of an insulative material on a semiconductor substrate, the stopper mask layer having an opening at a predetermined position thereof; the metal supplying step of supplying a metal into the opening of the stopper mask layer to form a projection electrode of the metal; and the step of removing the stopper mask layer from a surface thereof to allow the projection electrode to project from the resulting surface after the metal supplying step. The stopper mask layer is composed of a material which is less deformable when the projection electrode is formed.

According to this inventive aspect, the stopper mask layer is less liable to be deformed when the projection electrode is formed. Since the projection electrode can be formed in a shape conformal to the initial shape of the opening of the stopper mask layer, there is no possibility that adjacent projection electrodes are electrically short-circuited in contact with each other. Therefore, the pitch of the projection electrodes can be reduced.

After the metal supplying step, the stopper mask layer may partly be removed by a predetermined thickness as measured from a surface thereof. In this case, a remaining portion of the stopper mask layer serves as a protective film which covers an active layer. Since the stopper mask layer is composed of the insulative material, the protective film prevents the projection electrodes from being electrically short-circuited to each other, and rather functions to protect the semiconductor substrate (e.g., the active layer and electrodes formed in a surface of the semiconductor substrate).

In this case, the resulting projection electrodes each have a generally uniform width, and extend generally perpendicularly to the semiconductor substrate with distal portions thereof projecting from the protective film. That is, the projection electrodes do not overhang the protective film.

The thickness of the stopper mask layer to be removed is preferably not greater than one half of the height of the projection electrodes. In this case, at least proximal half portions of the projection electrodes are embedded in the protective film. Thus, the semiconductor substrate (the active layer and the electrodes) is advantageously protected.

The stopper mask layer may entirely be removed to allow the projection electrode to project from the semiconductor substrate after the metal supplying step.

The resulting semiconductor device can easily be connected to a wiring board via the projection electrodes thereof projecting from the stopper mask layer (protective film) or from the semiconductor substrate.

The stopper mask layer may have, for example, an elastic modulus of not lower than 1.5 GPa. The resist film (photoresist) employed in the conventional production method has an elastic modulus of about 1 GPa. Therefore, the stopper mask layer having an elastic modulus of not lower than 1.5 GPa is less liable to be deformed than the resist film employed in the conventional production method when a force is exerted thereon.

The stopper mask layer may be composed of silicon oxide or silicon nitride. Where the stopper mask layer of silicon oxide or silicon nitride is partly removed, the portion of the stopper mask layer remaining on the semiconductor substrate advantageously functions as a protective film.

The stopper mask layer may be composed of a resin, as long as the stopper mask layer of the resin is less liable to be deformed than the resist film employed in the conventional method when the projection electrode is formed.

In the metal supplying step, a chemical vapor deposition process or a sputtering process may be employed for the supply of the metal in the opening of the stopper mask layer. Alternatively, an electrolytic plating process or an electroless plating process may be employed.

The chemical vapor deposition process generally has a wider choice of metals to be employed for the film formation than the plating process. Therefore, there are many kinds of metals which can be supplied into the opening of the stopper mask layer in the metal supplying step according to this inventive aspect. That is, there is a wide choice of metals to be employed for the formation of the projection electrode in this production method.

Where the stopper mask layer is formed as having a small thickness, the supply of the metal in the opening of the stopper mask layer may be achieved by the sputtering process in the metal supplying step. The sputtering process generally has a wider choice of metals to be employed for the film formation than the plating process. Therefore, there is a wide choice of metals to be employed for the formation of the projection electrode.

Where the supply of the metal is achieved by the electrolytic plating process or the electroless plating process, the productivity can be increased.

A proper process may be selected from the aforesaid processes in accordance with the kind of the material for the stopper mask layer and the kind of the metal.

The semiconductor device production method according to this inventive aspect may further comprise the step of forming a metal thin film on the semiconductor substrate before the stopper mask layer formation step.

With this arrangement, the metal film can be formed on the metal thin film by bringing the metal thin film into contact with a plating liquid and employing the metal thin film as a seed layer for applying an electric current to the plating liquid for the electrolytic plating. Where the stopper mask layer is composed of a metal, for example, the formation of the stopper mask layer may be achieved by the electrolytic plating process.

In the stopper mask layer formation step, the stopper mask layer may be formed so as to expose the metal thin film in the opening. In this case, the plating liquid is brought into contact with the metal thin film exposed in the opening, and the metal thin film is employed as the seed layer for the electrolytic plating in the metal supplying step.

The metal thin film may function as a barrier metal layer (UBM; under bump metal) for preventing the diffusion of various kinds of atoms to protect the active layer and the electrodes formed in the surface of the semiconductor substrate. Even if the formation of the stopper mask layer and the projection electrode is achieved by the chemical vapor deposition process or the like other than the electrolytic plating process, the metal thin film may be formed.

The stopper mask layer formation step may comprise the steps of: forming a resist film having an etching aperture on the stopper mask layer; and etching the stopper mask layer through the etching aperture to form the opening in the stopper mask layer.

With this arrangement, the stopper mask layer initially having no opening is formed, and then the opening is formed in the stopper mask layer by an etching process employing the resist film. The etching aperture may be formed, for example, by a photolithography process employing a photoresist. Thus, the formation of the stopper mask layer having the opening at the predetermined position thereof can easily be achieved.

The etching of the stopper mask layer through the etching aperture may be achieved by a wet etching process, but preferably by a dry etching process. Since an etching medium impinges on the stopper mask layer generally perpendicularly to the semiconductor substrate for the etching in the dry etching process (particularly, an anisotropic dry etching process), the opening has an interior side wall generally perpendicular to the semiconductor substrate. In this case, the projection electrode provided in the metal supplying step has side faces generally perpendicular to the semiconductor substrate.

The stopper mask layer may be composed of a photosensitive material. In this case, the stopper mask layer formation step may comprise the step of exposing the stopper mask layer to light through a predetermined pattern mask and then developing the stopper mask layer to form the opening.

With this arrangement, the stopper mask layer or a precursor layer thereof is formed on the semiconductor substrate and then exposed to light through the predetermined pattern mask, whereby the etching resistance of the exposed portion of the layer is changed. Thereafter, the stopper mask layer is partly etched away (developed) with the use of a proper etching liquid thereby to be formed with the opening.

Hence, there is no need to additionally form a resist film for the formation of the opening in the stopper mask layer. In this case, a photoresist material (of a positive type or a negative type) having a high elastic modulus, or a photosensitive polyimide may be employed as the material for the stopper mask layer.

The semiconductor device production method according to this inventive aspect may further comprise the step of forming a diffusion prevention film on an exposed surface of the stopper mask layer for prevention of diffusion of atoms after the stopper mask layer formation step before the metal supplying step.

Depending on the kind of the material for the stopper mask layer and the kind of the metal for the formation of the projection electrode, there is a possibility that the metal reacts with the stopper mask layer when being brought into contact with the stopper mask layer. Particularly, where the stopper mask layer is formed of a metal and the formation of the stopper mask layer is achieved by the plating, such a reaction is more liable to occur.

With this arrangement, the reaction can be prevented by forming the diffusion prevention film on the exposed surface of the stopper mask layer. Thus, the selective removal of the stopper mask layer can more easily be achieved after the formation of the projection electrode.

The diffusion prevention film may be composed, for example, of an oxide or a nitride. Alternatively, the diffusion prevention film may be composed of the same metal as the barrier metal layer. Even in this case, the reaction of the stopper mask with the metal for the formation of the projection electrode can be prevented by properly selecting the metal for the diffusion prevention film. The diffusion prevention film of the metal can easily be removed by a wet etching process after the removal of the stopper mask layer. Therefore, where it is desired to finally provide a semiconductor device having no diffusion prevention film, the diffusion prevention film may be composed of the metal.

The semiconductor device production method according to this inventive aspect may further comprise the step of forming a metal thin film in the opening before the metal supplying step.

With this arrangement, the metal thin film can be employed as a seed layer for electrolytic plating with the metal. The metal thin film may function as a barrier metal layer for preventing the diffusion of various kinds of atoms to protect the active layer and the electrodes formed in the surface of the semiconductor device.

Where the stopper mask layer is composed of the insulative material, for example, the barrier metal layer can be formed only on a necessary portion of the resulting semiconductor device in the production method according to this inventive aspect. That is, the barrier metal layer is not formed on the entire surface of the active layer and electrode pads. Hence, there is no possibility that the electrode pads are short-circuited, even if the semiconductor device is produced by leaving the stopper mask layer of the insulative material thereon.

The metal supplying step may comprise the step of filling the opening with the metal. In this case, the semiconductor device production method may further comprise the planarization step of planarizing the surface of the stopper mask layer and the surface of a metal portion present in the opening by polishing to provide a continuous and flat surface after the metal supplying step.

Where the supply of the metal is achieved by the chemical vapor deposition process in the metal supplying step, for example, the metal is also supplied and deposited outside the opening on the stopper mask layer. With this arrangement, the metal deposited outside the opening is removed in the planarization step.

Where the stopper mask layer is formed with a plurality of openings, the planarization step ensures that the surfaces of metal portions present in the openings, i.e., the distal end faces of the resulting projection electrodes, are located within substantially the same plane. Where the surface of the semiconductor substrate formed with the projection electrodes is flat and the stopper mask layer has an even thickness, the projection electrodes have a uniform height. Therefore, when the resulting semiconductor device is connected to the electrode pads provided on the wiring board, all the projection electrodes can properly be brought into contact with the electrode pads of the wiring board, thereby ensuring proper mechanical bonding and proper electrical connections.

The planarization step may employ a chemical mechanical polishing (CMP) process. Where the stopper mask layer is composed of the metal, there is a small difference in chemical etchability between the stopper mask layer and the projection electrodes in the CMP process. In this case, the stopper mask layer may be composed of a harder metal than the projection electrodes, whereby polishing (grinding) extrusion can be prevented which may otherwise occur when the projection electrodes project from the stopper mask layer in the CMP process. Where the projection electrodes are composed of copper, the stopper mask layer may be composed of chromium which is harder than copper.

Before the metal supplying step, the surface of the stopper mask layer may preliminarily be planarized. In this case, the planarization step easily ensures that the distal end faces of the projection electrodes are located within substantially the same plane. Further, the stopper mask layer may be composed of a material which has a higher hardness (or a higher friction resistance) than the metal for the formation of the projection electrodes. Thus, virtually only the metal present outside the openings on the stopper mask layer can selectively be removed by the polishing.

The stopper mask layer formation step may comprise the steps of: forming a resist film having an etching aperture on the stopper mask layer; and etching the stopper mask layer through the etching aperture to form the opening. In this case, the metal supplying step may comprise the step of supplying the metal into the opening of the stopper mask layer through the etching aperture of the resist film.

With this arrangement, the opening is formed in the stopper mask layer with the use of the resist film, and then the metal is supplied into the opening in the presence of the resist film. Where the metal thin film is formed before the stopper mask layer formation step and the metal is supplied into the opening by a plating process by utilizing the metal thin film exposed in the bottom of the opening in the metal supplying step, the metal fills the opening and the etching aperture from the side of the metal thin film.

Therefore, the supply of the metal is stopped before the etching aperture is filled with the metal after the opening is filled with the metal. Thus, the metal is not present outside the opening of the stopper mask layer and the etching aperture.

Thereafter, the resist film is removed. Thus, a metal portion present above the opening projects from the surface of the stopper mask layer, and the metal is not present on the surface of the stopper mask layer. Where the resulting semiconductor substrate is planarized in the planarization step, the amount of the metal to be removed is reduced as compared with the case where the metal is present on the surface of the stopper mask layer. Therefore, where the metal contains an expensive metal such as gold, the costs can be reduce.

The semiconductor device production method according to this inventive aspect may further comprise the steps of: partly removing the metal portion present in the opening to form a recess above the metal portion after the planarization step; and forming a low melting point metal layer of a low melting point metal in a region including the recess, the low melting point metal having a lower solidus temperature than the projection electrode.

The recess may be formed, for example, by partly removing the metal portion by a predetermined thickness. The low melting point metal layer may be formed outside the recess as well. In this case, a portion of the low melting point metal layer present outside the recess may be removed, for example, by polishing after the low melting point metal layer formation step. Alternatively, the low melting point metal layer may be formed only in the recess, for example, by plating.

Thus, the low melting point metal layer can be provided only in the recess. Thereafter, the stopper mask layer is partly or entirely removed, whereby the low melting point metal layer is formed only on the distal end face of the projection electrode. Therefore, the semiconductor device can easily be produced, which includes the projection electrodes each having the low melting point metal layer formed only on the distal end face thereof by utilizing the recess. When the resulting semiconductor device is connected to the electrode pads and the like provided on the wiring board, the projection electrodes thereof can be bonded to the electrode pads of the wiring board by melting and solidifying the low melting point metal layers.

The low melting point metal layer may be composed, for example, of tin, indium, or an alloy of tin or indium.

In the metal supplying step, the supply of the metal may be stopped before the opening of the stopper mask layer is completely filled with the metal, whereby a recess is formed above a metal portion present in the opening. In this case, the semiconductor device production method according to this inventive aspect may further comprise the step of forming a low melting point metal layer of a low melting point metal in a region including the recess, the low melting point metal having a lower solidus temperature than the projection electrode.

With this arrangement, the formation of the recess is achieved not by once filling the opening with the metal and partly removing the metal portion present in the opening, but by controlling the supply amount of the metal so as not to completely fill the opening with the metal. This obviates the need for the step of partly removing the metal supplied into the opening, thereby simplifying the process.

This method can also provide the projection electrode having the low melting point metal layer formed only on the distal end face thereof. When the resulting semiconductor device is connected to the electrode pads and the like provided on the wiring board, the projection electrodes thereof can be bonded to the electrode pads of the wiring board by melting and solidifying the low melting point metal layers.

According to a third aspect of the present invention, there is provided a semiconductor device production method, which comprises the steps of: forming a stopper mask layer of a metal on a semiconductor substrate, the stopper mask layer having a flat surface; forming a recess at a predetermined position in the surface of the stopper mask layer; forming a low melting point metal layer of a low melting point metal in the recess; and etching the stopper mask layer by employing the low melting point metal layer formed in the recess as a mask to form a projection electrode which is constituted by a remaining portion of the stopper mask layer. The low melting point metal for the low melting point metal layer has a lower solidus temperature than the metal for the projection electrode.

According to this inventive aspect, the projection electrode is constituted by a part of the stopper mask layer. Therefore, the process can be simplified as compared with the case where the projection electrode is separately formed by utilizing the stopper mask layer having the opening.

The formation of the recess in the stopper mask layer may be achieved, for example, by employing a resist film having an etching aperture and etching the stopper mask layer through the etching aperture. In this case, the formation of the low melting point metal layer may be carried out in the presence of the resist film. Where the low melting point metal layer is also present outside the recess, a portion of the low melting point metal layer present outside the recess may be removed together with the resist film by polishing. Thus, the low melting point metal layer can be provided only in the recess.

Where a plurality of recesses are formed in the stopper mask layer, a plurality of low melting point metal layers are provided as a mask, which is employed for the etching of the stopper mask layer to provide a plurality of projection electrodes. If the recesses are generally uniform in depth and the low melting point metal layers are generally uniform in thickness, the distal end faces of the resulting projection electrodes are located within substantially the same plane, because the stopper mask layer has a flat surface before the formation of the recesses. If the surface of the semiconductor substrate formed with the projection electrodes is flat and the stopper mask layer has an even thickness, the projection electrodes are uniform in height. Therefore, the resulting semiconductor device can properly be connected to an external device via the projection electrodes.

According to a fourth aspect of the present invention, there is provided a semiconductor device production method, which comprises: the step of forming a stopper mask layer of an insulative material on a semiconductor substrate, the stopper mask layer having an opening at a predetermined position thereof; the metal supplying step of supplying a metal into the opening to form a projection electrode of the metal; and the planarization step of planarizing a surface of the stopper mask layer and a surface of a metal portion present in the opening by polishing to provide a continuous and flat surface after the metal supplying step. The stopper mask layer has a glass transition temperature which is lower than the solidus temperature of the projection electrode.

According to this inventive aspect, the projection electrode can be formed at the predetermined position on the semiconductor substrate by supplying the metal into the opening of the stopper mask layer. Where the stopper mask layer is formed with a plurality of openings, a plurality of projection electrodes are provided, and the planarization step makes it possible to locate distal end faces of the projection electrodes within substantially the same plane. Where the surface of the semiconductor substrate formed with the projection electrodes is flat and the stopper mask layer has an even thickness, the projection electrodes are uniform in height. Therefore, the resulting semiconductor device can properly be connected to an external device via the projection electrodes.

The stopper mask layer may be left but not removed after the formation of the projection electrodes. Semiconductor chips produced by dicing the resulting semiconductor substrate can each be employed, for example, as a semiconductor device for flip-chip connection. When the semiconductor device is heated at a temperature not lower than the glass transition temperature of the insulative material for the stopper mask layer for connection of the semiconductor device to electrode pads of a wiring board, the stopper mask layer is softened and fluidized to fill a space between the semiconductor substrate and the wiring board.

Thus, a surface of the semiconductor device opposed to the wiring board (e.g., a surface of the semiconductor device formed with an active layer including a functional device and interconnections) is protected by the stopper mask layer. That is, the stopper mask layer functions as an under-fill material. This obviates the step of separately filling the space between the semiconductor device and the wiring board with the under-fill material after the flip-chip connection of the semiconductor device (semiconductor chip).

The stopper mask layer may be composed, for example, of a thermoplastic resin or a glass. The stopper mask layer preferably has a glass transition temperature which is lower than a temperature (bonding temperature) employed for the bonding via the projection electrodes.

Where layers of a low melting point metal such as tin or indium are respectively formed on the projection electrodes, for example, the bonding via the projection electrodes is achieved at a temperature not lower than the melting point of the low melting point metal (237° C. for tin and 150° C. for indium). In this case, the glass transition temperature of the stopper mask layer is not higher than the bonding temperature, for example, if being not higher than the melting point (solidus temperature) of the low melting point metal.

Where the projection electrodes are composed of a metal such as gold or copper having a higher melting point and formed with no low melting point metal layer, the bonding temperature is in the range between a room temperature and about 350° C. depending on a bonding process. In this case, the stopper mask layer may have a glass transition temperature not higher than the bonding temperature.

Further, the continuous and flat surface is defined by the distal end faces of the projection electrodes and the surface of the stopper mask layer. Therefore, when the resulting semiconductor device is connected to the wiring board for the flip-chip connection, the space between the semiconductor device and the wiring board is generally occupied by the stopper mask layer before the softening of the stopper mask layer. In this state, the stopper mask layer is heated to be softened, whereby the space between the semiconductor device and the wiring board is filled with the stopper mask layer with little clearance.

Such semiconductor devices having the same construction can be connected to each other with the active layer sides thereof opposed to each other and with the corresponding projection electrodes thereof bonded to each other for so-called chip-on-chip connection. In this case, a space between the semiconductor devices (chips) bonded in opposed relation can be filled with the stopper mask layers of the semiconductor devices as in the case of the flip-chip connection.

This semiconductor device production method may further comprise the step of partly removing the stopper mask layer to allow the metal portion to project after the planarization step. The projection electrodes of the semiconductor device produced by this production method each have a distal portion projecting from the stopper mask layer.

Since the distal portions of the projection electrodes project from the stopper mask layer, the chip-on-chip connection can easily be achieved. In this case, the projection electrodes preferably project slightly from the stopper mask layer. Thus, the space between the semiconductor devices (chips) can virtually be filled with the stopper mask layers of the semiconductor devices.

Further, one of the semiconductor devices (chips) for the chip-on-chip connection may include the projection electrodes having the distal portions projecting from the stopper mask layer, and the other semiconductor device may include the projection electrodes having the distal end faces generally flush with the surface of the stopper mask layer.

This semiconductor device production method may further comprise the step of partly removing the metal portion present in the opening to form a recess above the metal portion after the planarization step.

A semiconductor device produced by this production method can be connected to the semiconductor device including the projection electrodes having the distal portions projecting from the stopper mask layer for chip-on-chip connection. In this case, these semiconductor devices can be connected to each other with the projecting projection electrodes of one of the semiconductor devices fitted in the recesses of the other semiconductor device. Thus, the corresponding projection electrodes of these semiconductor devices can easily be connected, and a space between the semiconductor devices can virtually be filled with the stopper mask layers of the semiconductor devices.

The semiconductor device production method may further comprise the step of forming a low melting point metal layer of a low melting point metal in a region including the recess, the low melting point metal having a lower solidus temperature than the projection electrode.

The resulting semiconductor device can be connected to the wiring board with the projection electrodes thereof bonded to the electrode pads and the like of the wiring board by melting the low melting point metal layers by heating and solidifying the low melting point metal layers. The heating temperature may be not lower than the melting point (solidus temperature) of the low melting point metal and not lower than the glass transition temperature of the stopper mask layer. Thus, the projection electrodes can be bonded to the electrode pads of the wiring board and, at the same time, the space between the semiconductor substrate and the wiring board can be filled with the stopper mask layer.

Further, two such semiconductor devices having the same construction may be connected to each other with the corresponding projection electrodes thereof opposed to each other. In this case, the projection electrodes of one of the semiconductor devices preferably each have a distal end portion (low melting point metal layer) flush or slightly recessed with respect to the surface of the stopper mask layer, and the projection electrodes of the other semiconductor device preferably each have a distal end portion slightly projecting from the surface of the stopper mask layer. Thus, the two semiconductor devices can properly be bonded to each other, and a space between these semiconductor devices can properly be filled with the stopper mask layers of the semiconductor devices by heating and softening the stopper mask layers.

Where the low melting point metal layer is also formed outside the recess in the low melting point metal layer formation step, a portion of the low melting point metal layer present outside the recess may be removed by polishing. The projection electrode having the low melting point metal layer formed only on the distal end face thereof can easily be provided by utilizing the recess.

This semiconductor device production method may further comprise the step of forming a low melting point metal layer of a low melting point metal on the distal end face of the projection electrode provided in the metal supplying step, the low melting point metal having a lower solidus temperature than the projection electrode.

With this arrangement, the semiconductor device can be connected to the electrode pads on the wiring board for flip-chip connection or to another semiconductor device having the same construction for chip-on-chip connection by melting and solidifying the low melting point metal layers. For the bonding (connection), the stopper mask layer is heated at a proper temperature so as to be fluidized, whereby a space between the semiconductor device (chip) and the electrode pads of the wiring board or between the semiconductor devices (chips) is filled with the stopper mask layer.

The semiconductor device production method may further comprise the step of partly removing the metal portion present in the opening to form a recess above the metal portion after the planarization step before the low melting point metal layer formation step. In this case, the low melting point metal layer formation step may comprise the step of forming the low melting point metal layer in a region including the recess.

With this arrangement, the low melting point metal layer can be formed on the distal end of the projection electrode by utilizing the recess.

This semiconductor device production method may further comprise the step of partly removing the stopper mask layer to allow the low melting point metal layer and the projection electrode to project from a surface of a remaining portion of the stopper mask layer after the low melting point metal layer formation step.

With this arrangement, the projection electrode is allowed to project from the stopper mask layer after the formation of the low melting point metal layer. Therefore, the low melting point metal layer can easily be formed only on the distal end of the projection electrode by utilizing the recess.

According to a fifth aspect of the present invention, there is provided a semiconductor device production method, which comprises: the step of forming a stopper mask layer on a semiconductor substrate, the stopper mask layer having an opening at a predetermined position thereof and having a surface contained within substantially the same plane except for the opening; the paste filling step of filling an electrically conductive thermosetting paste in the opening so that a surface of a conductive paste portion present in the opening is flush with the surface of the stopper mask layer; the curing step of curing the conductive paste portion by heating after the paste filling step; and the step of forming a low melting point metal layer of a low melting point metal in a region including a recess which is formed due to contraction of the conductive paste portion in the curing step.

According to this inventive aspect, the surface of the stopper mask layer except for the opening is generally flat, and the conductive paste is filled in the opening so that the surface of the conductive paste portion present in the opening is generally flush with the surface of the stopper mask layer. Therefore, where the stopper mask layer is formed with a plurality of openings, surfaces of conductive paste portions present in the respective openings are contained in substantially the same plane. Since the same electrically conductive paste has substantially the same contraction rate, the surfaces of the cured conductive paste portions, i.e., the distal end faces of the resulting projection electrodes, are located within substantially the same plane. Therefore, the resulting semiconductor device can properly be connected to an external device via the projection electrodes.

The formation of the low melting point metal layer on the distal end of the projection electrode can be achieved by utilizing the recess of the stopper mask layer.

The recess is formed when the conductive paste is cured to be contracted. Therefore, the formation of the recess can easily be achieved as compared with the case where the formation of the recess is achieved by etching or the like.

The low melting point metal layer formation step may comprise the step of forming the low melting point metal layer by a chemical vapor deposition process.

The low melting point metal layer formation step may comprise the step of forming the low melting point metal layer by a sputtering process.

Thus, the low melting point metal layer can be formed as having an even thickness and a high quality by the chemical vapor deposition process or the sputtering process.

The low-melting point metal layer formation step may comprise the step of forming the low melting point metal layer by an electroless plating process.

With this arrangement, the low melting point metal can be supplied only into the recess by the electroless plating process. This obviates the need for removing a portion of the low melting point metal present outside the recess after the step of low melting point metal supplying step.

The foregoing and other objects, features and effects of the present invention will become more apparent from the following description of the preferred embodiments with reference to the attached drawings.

BRIEF DESCRIPTION OF THE DRAWINGS

FIG. 11 is a schematic sectional view of a semiconductor device produced by a production method according to a third embodiment of the present invention;

DESCRIPTION OF THE PREFERRED EMBODIMENTS

Figure 1:
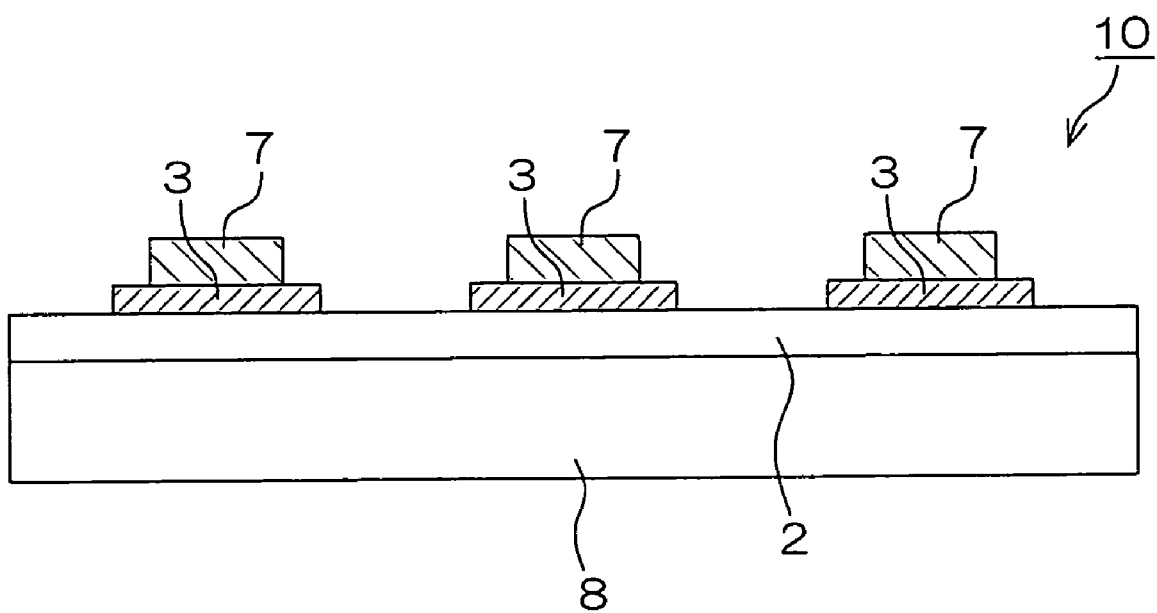
FIG. 1 is a schematic sectional view of a semiconductor device produced by a production method according to a first embodiment of the present invention.

FIG. 1 is a schematic sectional view of a semiconductor device produced by a production method according to a first embodiment of the present invention.

The semiconductor device 10 includes a semiconductor substrate 8 not packaged, and is capable of so-called flip-chip connection. An active layer 2 including a functional device and interconnections is provided in one surface of the semiconductor substrate 8, and electrode pads and interconnections (hereinafter referred to generally as "electrode pads") 3 such as of aluminum (Al), copper (Cu), an alloy of aluminum or copper or gold (Au) electrically connected to the functional device in the active layer 2 are provided at predetermined positions on the active layer 2. A passivation film (not shown) for protecting the active layer 2 is provided on the active layer 2 with the electrode pads 3 exposed therefrom.

Column-shaped projection electrodes 7 respectively project from the electrode pads 3. The projection electrodes 7 and the electrode pads 3 may be composed of different materials or the same material. The semiconductor device 10 can be connected to a wiring board with the projection electrodes 7 thereof being bonded to electrode pads provided on the wiring board for flip-chip connection. Thus, the functional device in the active layer 2 can be connected to an external device via the electrode pads 3 and the projection electrodes 7.

FIGS. 2(a), 2(b) and 2(c) and FIGS. 3(d), 3(e) and 3(f) are schematic sectional views for explaining the production method for the semiconductor device 10 shown in FIG. 1.

Figure 2A:
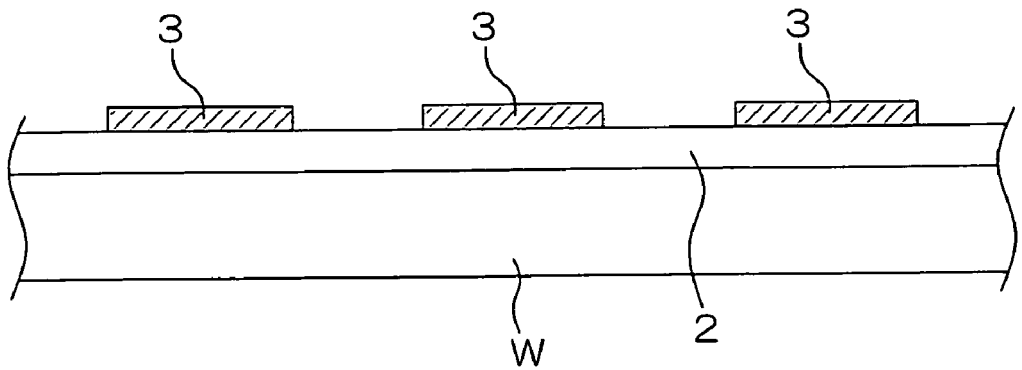
FIGS. 2(*a*), 2(*b*) and 2(*c*) are schematic sectional views for explaining the production method for the semiconductor device shown in FIG. 1.

First, an active layer 2 including a functional device and interconnections is formed in one surface of a preliminarily planarized semiconductor wafer (hereinafter referred to simply as "wafer") Was one example of the semiconductor substrate, and electrode pads 3 are formed at predetermined positions on the active layer 2. This state is shown in FIG. 2(a). Thereafter, a passivation film (not shown) is formed on the resulting wafer W so as to expose the electrode pads 3.

In turn, a stopper mask layer 4 of a metal is formed on the entire surface of the resulting wafer W on the side of the active layer 2 by electrolytic plating, electroless plating, chemical vapor deposition (CVD), sputtering or the like. The material for the stopper mask layer 4 is harder than that for projection electrodes 7. Where the projection electrodes 7 are composed of gold (having a Vickers hardness of 24) or copper (having a Vickers hardness of 78), for example, the stopper mask layer 4 may be composed of chromium (Cr, having a Vickers hardness of 130).

Where the formation of the stopper mask layer 4 is achieved by the electrolytic plating, an electrically conductive seed layer is preliminarily formed on the surface of the wafer W on the active layer side by sputtering. An electric current is applied to a plating liquid via the seed layer, whereby metal atoms are deposited on the seed layer for the formation of the stopper mask layer 4.

Figure 2B:
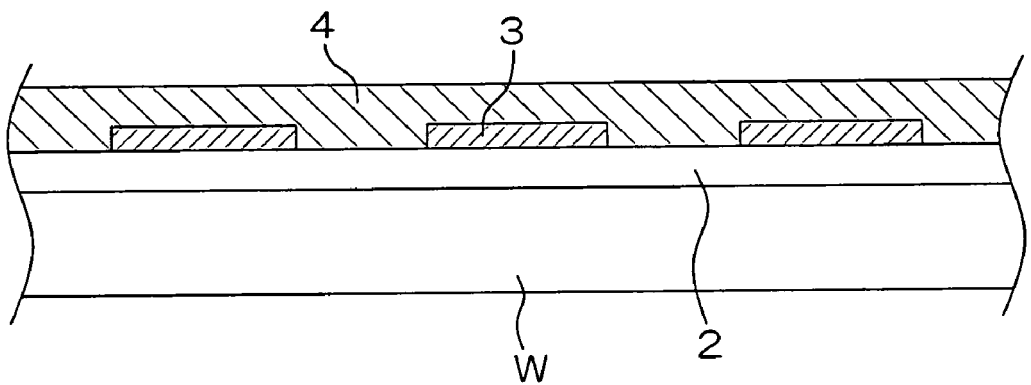
Figure 2C:
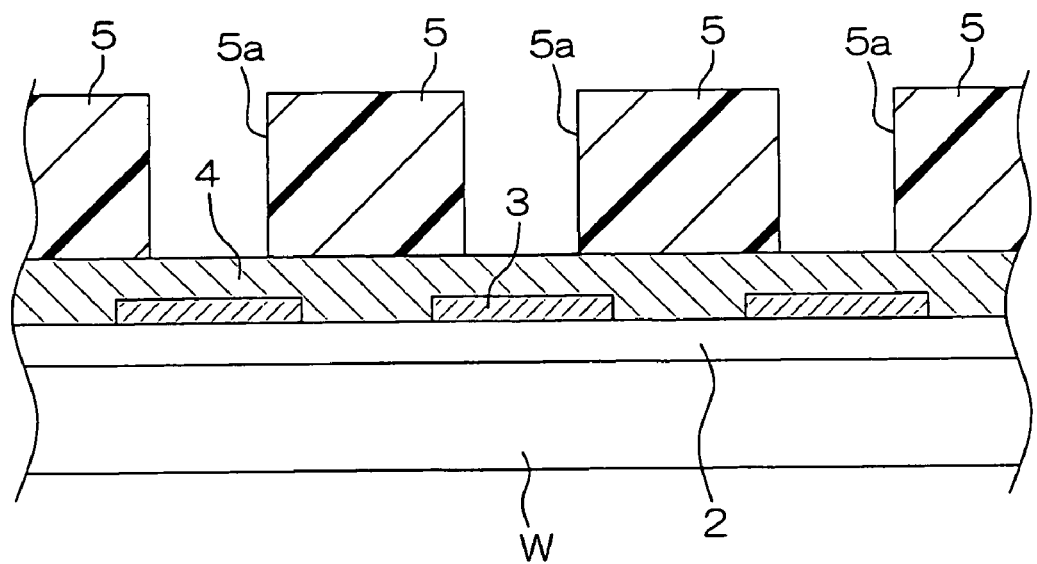

If the resulting stopper mask layer 4 has an uneven thickness or has a poor surface planarity, the surface of the stopper mask layer 4 is planarized to an even thickness by chemical mechanical polishing (CMP) (see FIG. 2(b)).

Subsequently, a resist film (photoresist) 5 is formed over the stopper mask layer 4, and apertures 5a for etching are formed in the resist film 5 by removing portions of the resist film 5 located above the electrode pads 3 by photolithography. The etching apertures 5a each have a width, for example, which is smaller than the width of the electrode pads 3 and greater than the width of portions of the electrode pads 3 exposed from the passivation film (not shown) (see FIG. 2(c)). However, the width of the etching apertures 5a is not limited to that defined above.

Thereafter, the stopper mask layer 4 is etched through the etching apertures 5a of the resist film 5. Thus, the stopper mask layer 4 is formed with openings 4a which are respectively continuous to the etching apertures 5a of the resist film 5. The electrode pads 3 are exposed from bottom portions of the openings 4a.

Figure 3D:
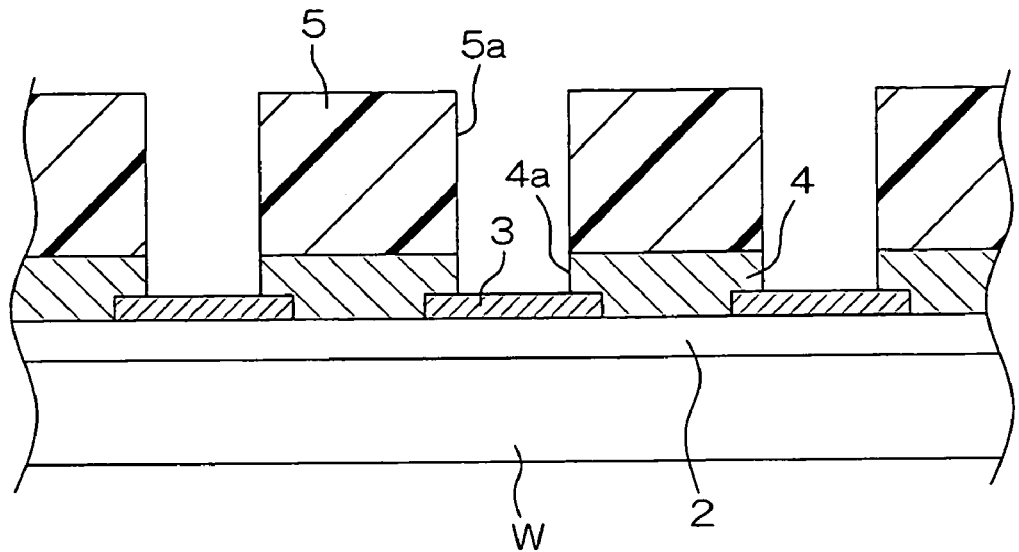
FIGS. 3(*d*), 3(*e*) and 3(*f*) are schematic sectional views for explaining the production method for the semiconductor device shown in FIG. 1.

This step may employ a wet etching process utilizing an etching liquid, but preferably an anisotropic dry etching process. Since the dry etching is achieved by bombarding an etching medium on the stopper mask layer 4 generally perpendicularly to the wafer W, the openings 4a have interior side walls generally perpendicular to the wafer W as shown in FIG. 3(d). Where the electrode pads 3 have a higher etching resistance than the stopper mask layer 4, it is possible to etch the stopper mask layer 4 without etching the electrode pads 3.

Figure 3E:
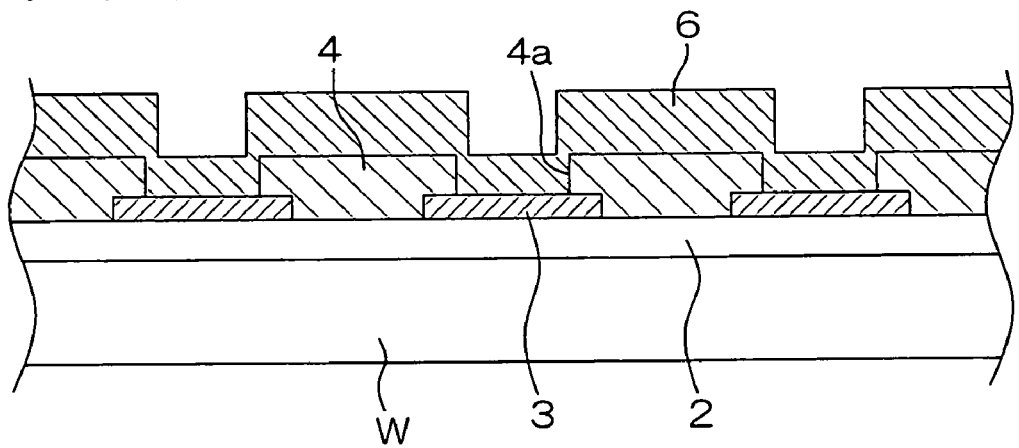

After the resist film 5 is removed, a metal film 6 such as of gold is formed by supplying gold on the surface of the resulting wafer W on the active layer side to completely fill the openings 4a with gold by chemical vapor deposition or sputtering. The metal film 6 is also deposited on the stopper mask layer 4 as shown in FIG. 3(e).

In turn, the surface of the wafer W formed with the metal film 6 is polished (ground), for example, by CMP, whereby a portion of the metal film 6 formed outside the openings 4a is removed. This step may employ only a mechanical polishing process without employing a chemical polishing process. At this time, the stopper mask layer 4 prevents polishing dust of the metal film 6 from reaching the active layer 2.

Figure 3F:
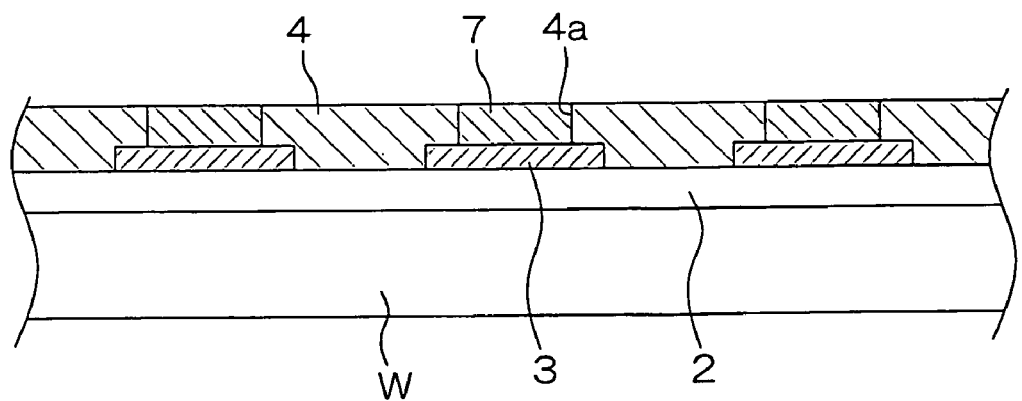

Thus, a continuous and flat surface is defined by the surface of the stopper mask layer 4 and the surfaces of metal film portions 6 left in the openings 4a (see FIG. 3(f)).

Where the stopper mask layer 4 is composed of chromium, for example, the stopper mask layer 4 is harder than the metal film 6 of gold. Therefore, the removal of the stopper mask layer 4 can be suppressed after the portion of the metal film 6 on the stopper mask layer 4 is removed by the mechanical polishing process.

The metal film portions 6 left in the openings 4a serve as the projection electrodes 7 respectively bonded to the electrode pads 3. There is no possibility that the distal end faces of the projection electrodes 7 each have a recessed center portion which may otherwise be formed by the influence of the steps due to the presence of the passivation film (not shown) like the distal end faces of the projection electrodes 106 formed by the conventional method (see FIGS. 26(c), 26(d), 27(e), 28(f) and 28(g)).

In turn, the stopper mask layer 4 is removed by wet etching, whereby the projection electrodes 7 project from the electrode pads 3. In this step, the stopper mask layer 4 is etched away by employing an etching liquid more corrosive to the stopper mask layer 4 (e.g., chromium) than to the metal film 6 (e.g., gold). This step may employ a dry etching process.

Thereafter, the wafer W is diced into pieces of the semiconductor substrate 8. Thus, the semiconductor device 10 shown in FIG. 1 is provided.

Figure 26A:
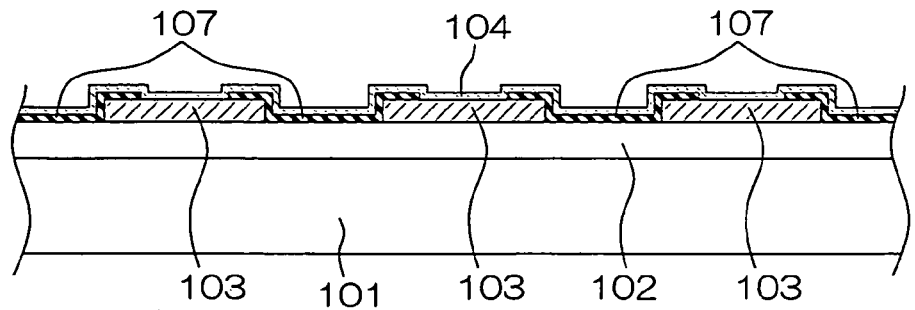
FIGS. 26(a), 26(b), 26(c) and 26(d) are schematic sectional views for explaining a production method for a conventional semiconductor device having projection electrodes.
Figure 26B:
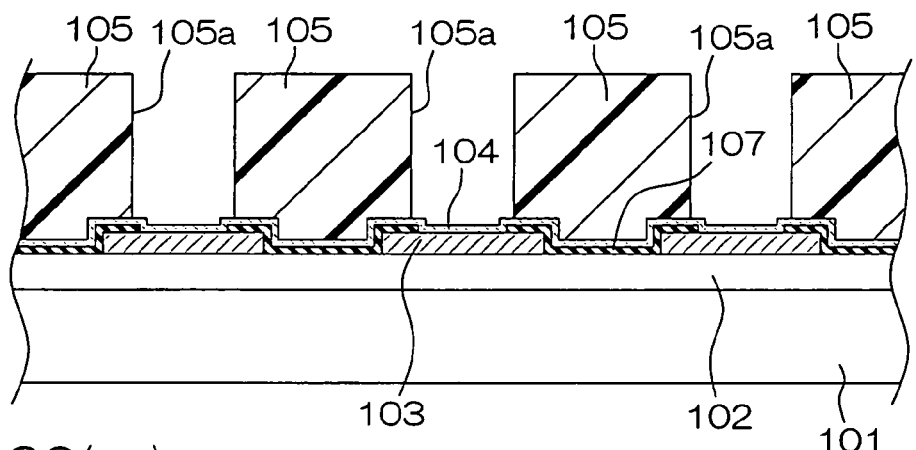
Figure 26C:
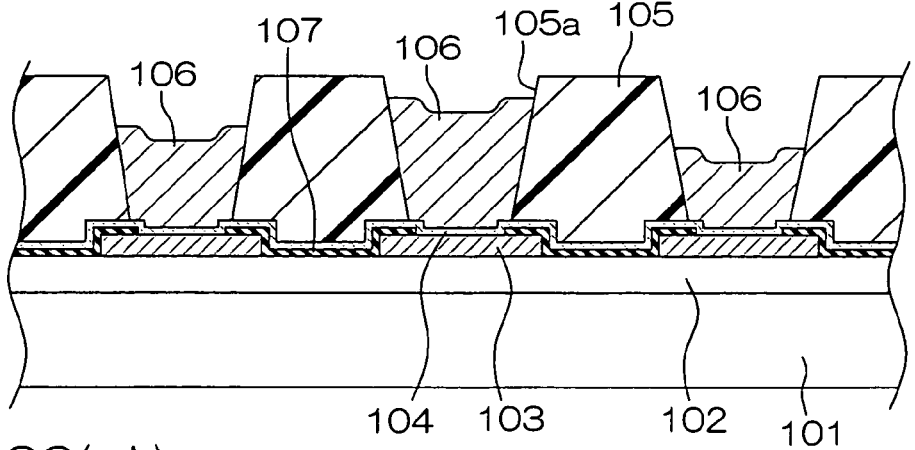
Figure 26D:
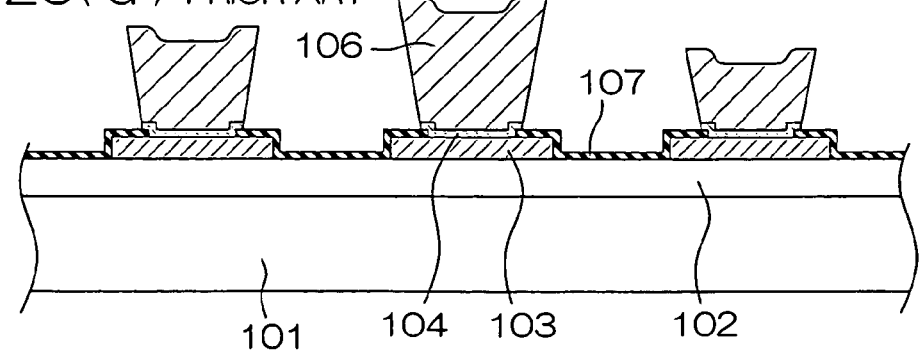
Figure 27E:
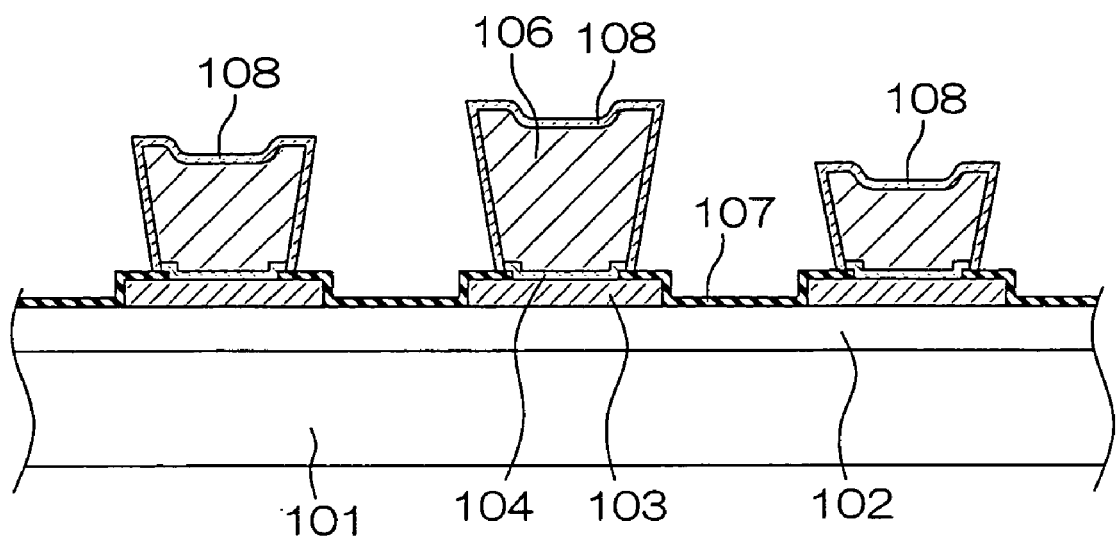
FIG. 27(e) is a schematic sectional view for explaining a production method for a conventional semiconductor device including projection electrodes formed with low melting point metal layers.
Figure 28F:
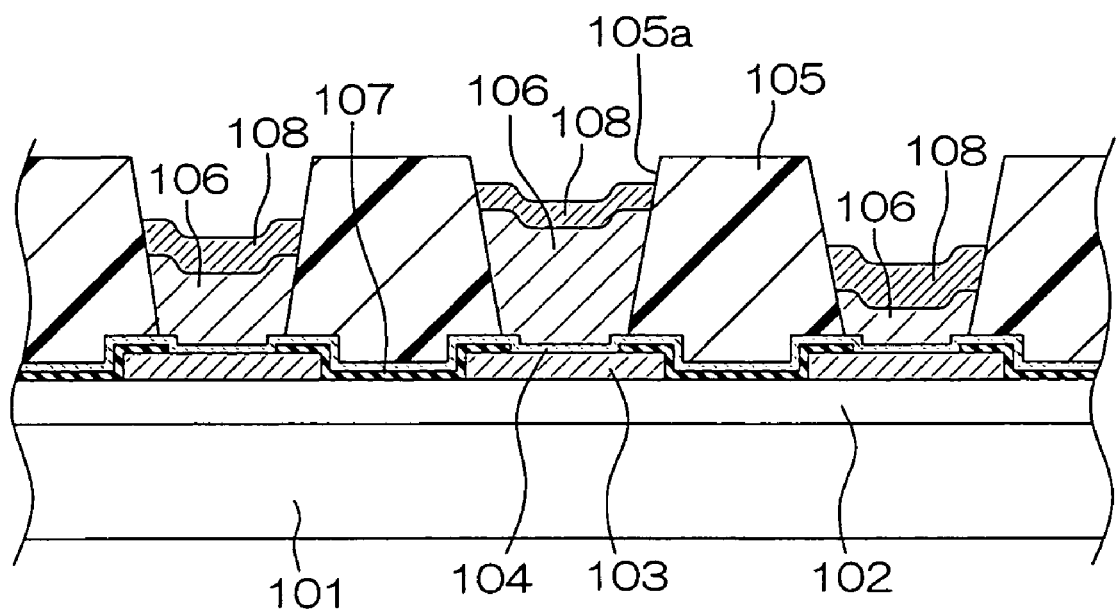
FIGS. 28(f) and 28(g) are schematic sectional views for explaining a production method for a conventional semiconductor device including projection electrodes formed with low melting point metal layers.
Figure 28G:
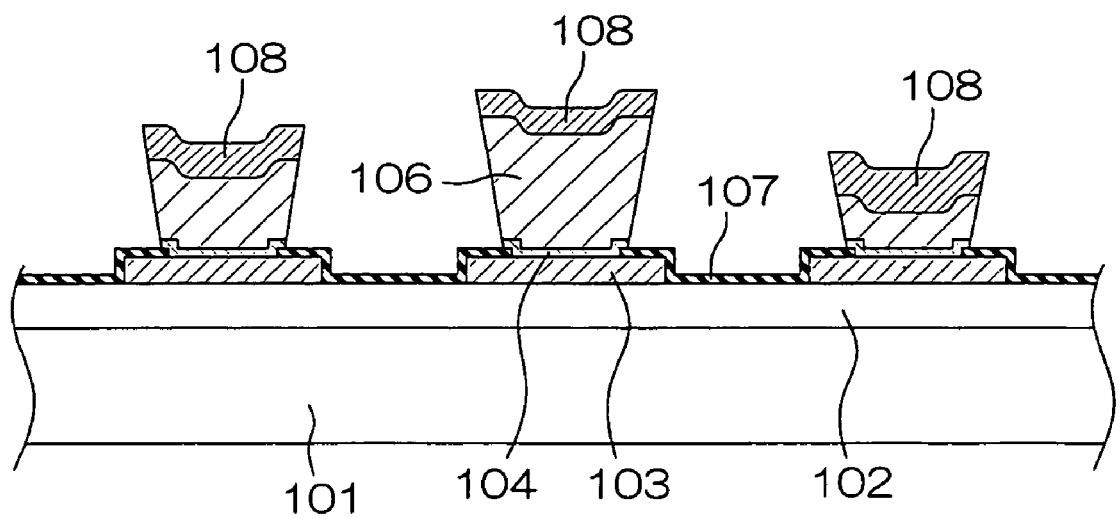

In the semiconductor device production method described above, the stopper mask layer 4 of chromium has a higher elastic modulus and a higher shear modulus than the resist film (photoresist) 105 employed in the conventional production method (see FIGS. 26(b) and 26(c)) and, hence, is less liable to be deformed when a force is exerted thereon. Therefore, when the metal film 6 is formed, the side faces of the metal film portions 6 extending along the side walls of the openings 4a are generally perpendicular to the wafer W in conformity with the initial shape of the openings 4a. Therefore, the projection electrodes 7 have side faces generally perpendicular to the wafer W (or straight side faces). That is, there is no possibility that the projection electrodes 7 each have a width progressively increased toward the distal end thereof during the growth thereof and an inverted trapezoidal section like the projection electrodes 106 formed by the conventional production method (see FIG. 26(d)).

Particularly, where the projection electrodes 7 are designed so as to be arranged at a reduced interval (or at a reduced pitch), the stopper mask layer 4 has a reduced thickness, but is less liable to be deformed. Therefore, even if the projection electrodes 7 are designed so as to be arranged at a reduced interval (or at a reduced pitch), the distal ends of the adjacent projection electrodes 7 are not easily brought into contact with each other, nor electrically short-circuited. That is, this production method makes it possible to produce a semiconductor device 10 having projection electrodes 7 arranged at a reduced pitch.

Since the surface of the stopper mask layer 4 is planarized before the formation of the metal film 6, the projection electrodes 7 formed by polishing the metal film 6 are highly uniform in height. Even if the wafer W has a poor surface planarity, the distal end faces of the projection electrodes 7 are located within the same plane with a high level of accuracy. Therefore, when the semiconductor device 10 having such projection electrodes 7 is connected to a wiring board for flip-chip connection, the semiconductor device 10 can properly be bonded to the wiring board with all the projection electrodes 7 thereof kept in contact with electrode pads provided on the wiring board. The non-recessed flat distal end faces of the projection electrodes 7 also ensure the proper bonding.

In the conventional production method employing the resist film 105, the projection electrodes 106 are formed so as not to project out of the surface of the resist film 105. Therefore, the distal end faces of the projection electrodes 106 can be polished only after the removal of the resist film 105. In this case, however, only the distal ends of the projection electrodes 106 receive a polishing pressure, so that the polishing is not easy.

In this embodiment, on the contrary, a polishing pressure occurring when the metal film 6 is polished (ground) is received by the entire surface of the stopper mask layer 4. Hence, there is no need to employ a special polishing process, but ordinary mechanical polishing processes (including CMP) can be employed.

Even if the film formation by the plating is difficult, the film formation may be achieved by the chemical vapor deposition or the sputtering. Where the electrolytic plating process is employed for the film formation, for example, pattern openings for exposure to the plating liquid should have a relatively great size. In the case of the electroless plating process, the kind of the metal to be employed for the plating is determined by the kind of the metal constituting the base to be subjected to the plating. On the contrary, the chemical vapor deposition and the sputtering are free from such limitations, facilitating the formation of the projection electrode 7.

Where the formation of the metal film 6 is achieved by the chemical vapor deposition or the sputtering, there is no need to form the barrier metal layer (UBM; under bump metal) as the seed layer. Hence, this method is free from the problem associated with the over-etching of the barrier metal layer which may occur when an unnecessary portion of the barrier metal layer is removed after the formation of the projection electrodes 7.

Figure 4:
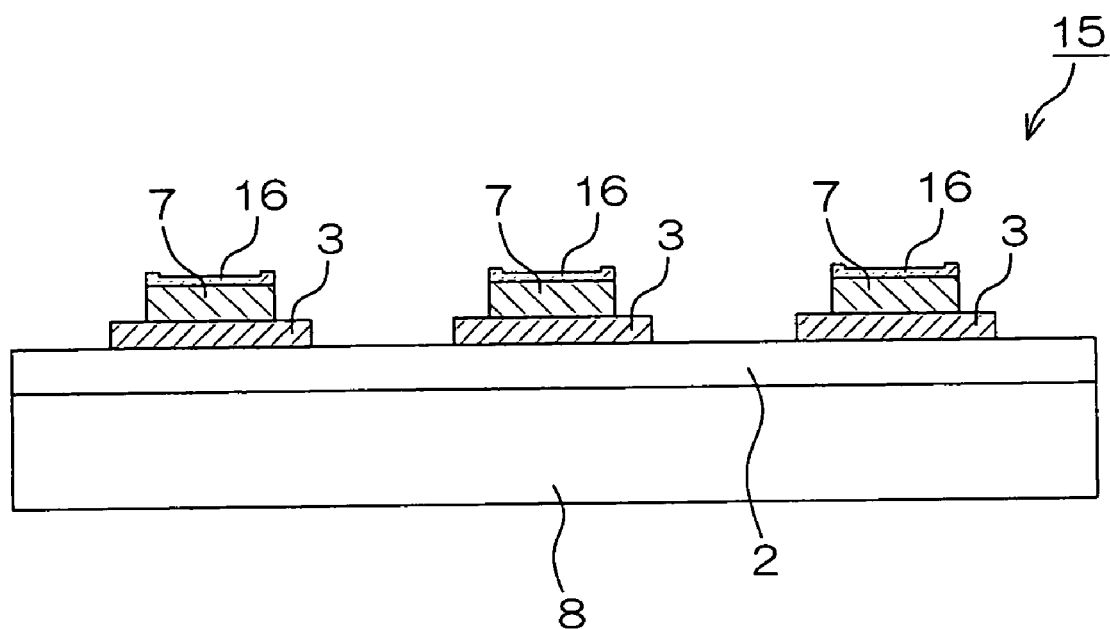
FIG. 4 is a schematic sectional view of a semiconductor device produced by a production method according to a modification of the first embodiment.

FIG. 4 is a schematic sectional view of a semiconductor device produced by a production method according to a modification of the first embodiment. In FIG. 4, components equivalent to those of the semiconductor device 10 shown in FIG. 1 are denoted by the same reference characters as in FIG. 1, and no explanation will be given thereto.

In the semiconductor device 15, thin layers 16 of a low melting point metal such as tin (Sn), indium (In) or an alloy of tin or indium are respectively provided on the distal end faces of the projection electrodes 7. The semiconductor device 15 can be connected to electrode pads provided on a wiring board for flip-chip connection by melting and solidifying the low melting point metal layers 16.

Figure 5G:
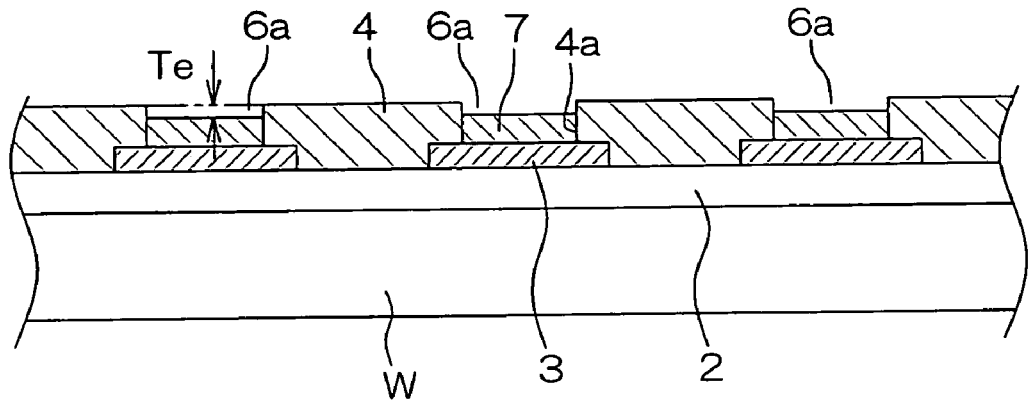
FIGS. 5(*g*), 5(*h*) and 5(*i*) are schematic sectional views for explaining the production method for the semiconductor device shown in FIG. 4.
Figure 5H:
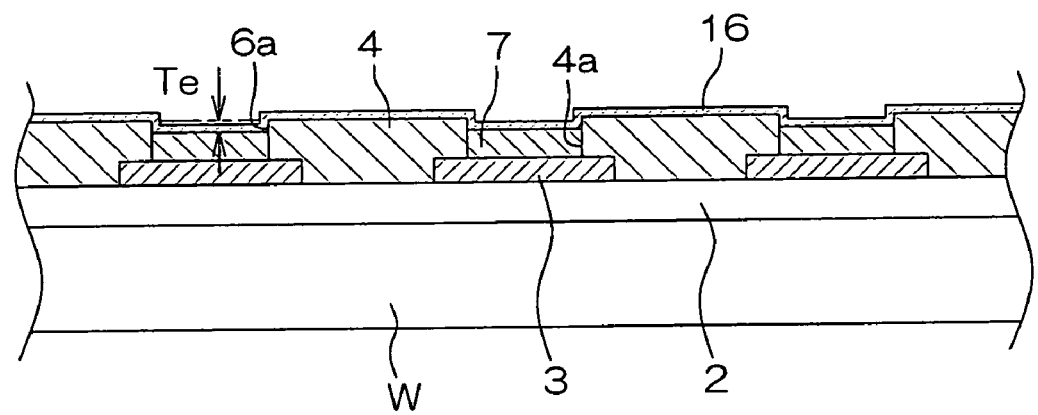
Figure 5I:
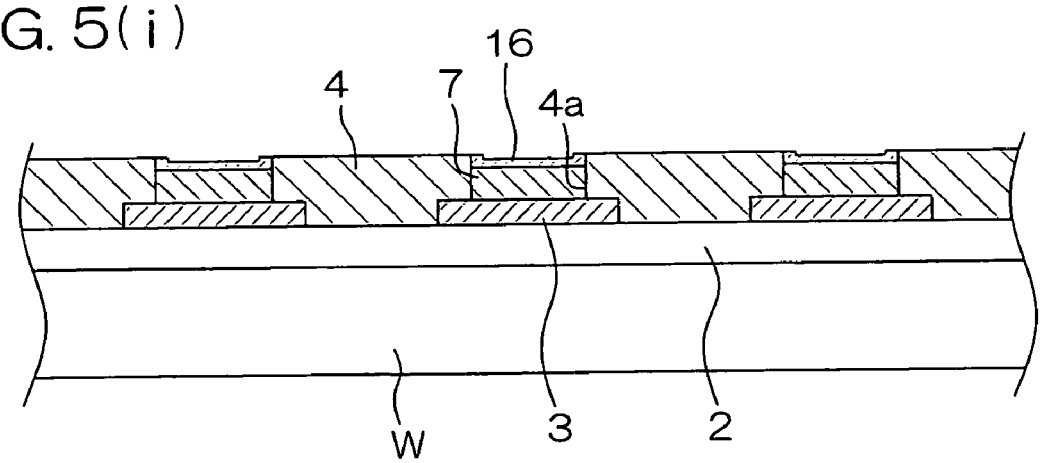

FIGS. 5(g), 5(h) and 5(i) are schematic sectional views for explaining the production method for the semiconductor device 15 shown in FIG. 4. In FIGS. 5(g), 5(h) and 5(i), components equivalent to those of the wafer W shown in FIGS. 3(d), 3(e) and 3(f) are denoted by the same reference characters as in FIGS. 3(d), 3(e) and 3(f), and no explanation will be given thereto.

The projection electrodes 7 formed on the wafer W (see FIG. 3(f)) by the polishing of the metal film 6 by the CMP or the like by the production method according to the first embodiment are dry-etched or wet-etched so as to be partly removed by a predetermined thickness (hereinafter referred to as "etch-back thickness") Te. Thus, recesses 6a are respectively formed above the projection electrodes 7. This state is shown in FIG. 5(g).

Then, a low melting point metal layer 16 of a low melting point metal such as tin, indium or an alloy of tin or indium is formed on a surface of the resulting wafer W on the side of the active layer 2 by chemical vapor deposition or sputtering. Thus, the low melting point metal layer 16 is provided on the surface of the stopper mask layer 4 and the surfaces of the projection electrodes 7 stepped by the recesses 6a. The thickness of the low melting point metal layer 16 may be smaller than the etch-back thickness Te (see FIG. 5(h)) or greater than the etch-back thickness Te. Where the thickness of the low melting point metal layer 16 is greater than the etch-back thickness Te, the formation of the low melting point metal layer 16 may be achieved by a dip method.

Subsequently, the low melting point metal layer 16 is polished (ground) until the stopper mask layer 4 is exposed. Thus, portions of the low melting point metal layer 16 are left only in the recesses 6a (see FIG. 5(i)). Thereafter, the stopper mask layer 4 is removed by wet etching, whereby the projection electrodes 7 project from the electrode pads 3.

Where the formation of the low melting point metal layer 16 is achieved by the chemical vapor deposition, the low melting point metal is deposited on the interior side walls of the recesses 6a as well. Therefore, portions of the low melting point metal layer 16 present on the peripheral edges of the distal end faces of the projection electrodes 7 slightly project from the other portion of the low melting point metal layer 16. Where the formation of the low melting point metal layer 16 is achieved by the sputtering, the low melting point metal is hardly deposited on the interior side walls of the recesses 6a. Therefore, the low melting point metal layer 16 has no projection unlike the low melting point metal layer 16 formed by the chemical vapor deposition. Where the low melting point metal layer 16 is formed to completely fill the recesses 6a, the low melting point metal layer 16 has no projection irrespective of the method for the formation of the low melting point metal layer 16.

The aforesaid wet etching process employs an etching liquid more corrosive to the stopper mask layer 4 (chromium) than to the metal film 6 (gold) and the low melting point metal layer 16 (tin, indium or the like).

Thereafter, the wafer W is diced into pieces of the semiconductor substrate 8. Thus, the semiconductor device 15 shown in FIG. 4 is provided.

In the aforesaid production method for the semiconductor device 15, the formation of the low melting point metal layer 16 is achieved by the chemical vapor deposition or the sputtering, which ensures that the film is formed as having a small thickness and a high quality with a high level of accuracy. If the formation of the low melting point metal layer 16 is achieved by electroless plating, for example, a variation in the thickness of the low melting point metal layer 16 is on the order of several micrometers. In the case of the chemical vapor deposition and the sputtering, on the other hand, the thickness variation is on the order of several angstroms.

The kind of the metal to be employed for the film formation by the electroless plating is further limited as compared with the film formation by the electrolytic plating. However, the chemical vapor deposition and the sputtering can employ various kinds of low melting point metals for the formation of the low melting point metal layer 16 without the limitation.

Since the low melting point metal layers 16 are respectively formed only on the distal end faces of the projection electrodes 7 in the production method according to this embodiment, the semiconductor device 15 can properly be connected to an external device without any of the inconveniences described above.

The metal layer portions 6 present in the openings 4a are formed with the recesses 6a (see FIG. 5(g)) by the dry etching or the wet etching but, instead, the supply of the metal material for the metal layer 6 may be stopped before the openings 4a are completely filled with the metal material in the step of forming the metal film 6 (see FIG. 3(e)). In this case, recesses as shown in FIG. 5(g) are provided by removing a portion of the metal film 6 present outside the openings 4a by the CMP.

Figure 6:
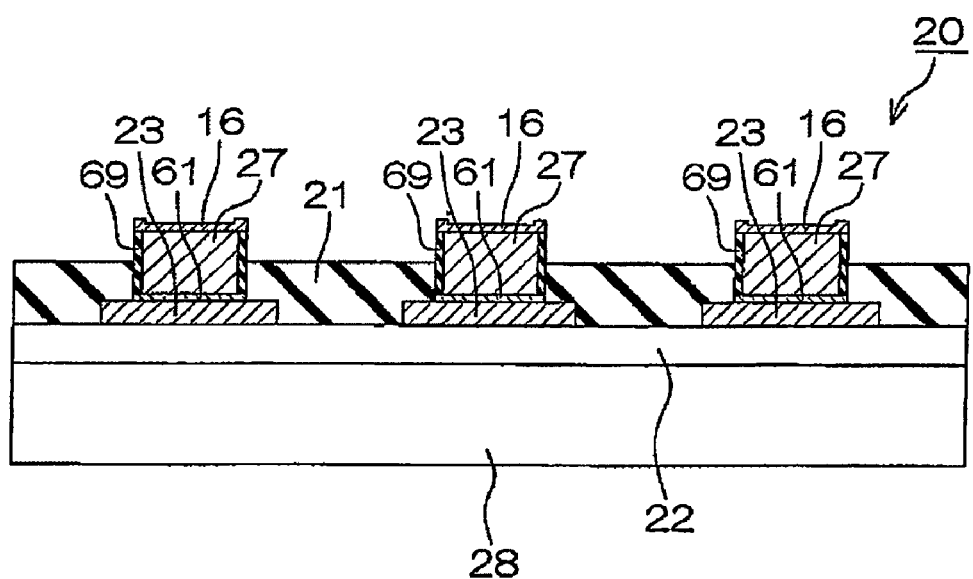
FIG. 6 is a schematic sectional view of a semiconductor device produced by a production method according to a second embodiment of the present invention.

FIG. 6 is a schematic sectional view of a semiconductor device produced by a production method according to a second embodiment of the present invention.

The semiconductor device 20 includes a semiconductor substrate 28 not packaged, and is capable of so-called flip-chip connection. An active layer 22 including a functional device and interconnections is provided in one surface of the semiconductor substrate 28, and electrode pads and interconnections (hereinafter referred to generally as "electrode pads") 23 electrically connected to the functional device in the active layer 22 are provided at predetermined positions on the active layer 22. A passivation film (not shown) for protecting the active layer 22 is provided on the active layer 22 with the electrode pads 23 exposed therefrom. Column-shaped projection electrodes 27 are respectively bonded to the electrode pads 23 generally perpendicularly to the electrode pads 23.

A protective film 21 is provided on the active layer 22 so that the entire electrode pads 23 and proximal half portions of the projection electrodes 27 are embedded therein. Distal half portions of the projection electrodes 27 project from the protective film 21. The protective film 21 is composed of an insulative material such as silicon oxide ($SiO_2$). The projection electrodes 27 each have a generally uniform width, and extend generally perpendicularly to the semiconductor substrate 28. Further, the projection electrodes 27 do not overhang the protective film 21.

The semiconductor device 20 is connected to a wiring board with the projection electrodes 27 thereof being bonded to electrode pads provided on the wiring board for flip-chip connection. By the provision of the protective film 21 in addition to the passivation film, the device formed in the active layer 22 is less liable to be damaged.

FIGS. 7(a), 7(b) and 7(c) and FIGS. 8(d), 8(e) and 8(f) are schematic sectional views for explaining the production method for the semiconductor device 20 shown in FIG. 6.

Figure 7A:
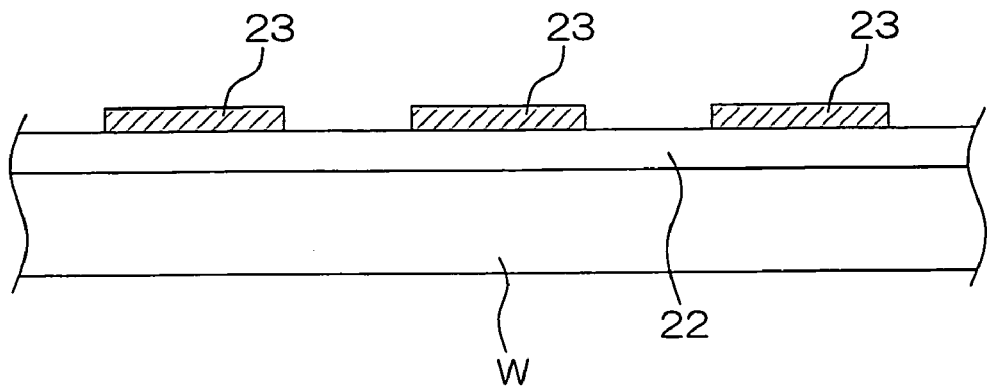
FIGS. 7(*a*), 7(*b*) and 7(*c*) are schematic sectional views for explaining the production method for the semiconductor device shown in FIG. 6.

First, an active layer 22 including a functional device and interconnections is formed in one surface of a wafer W, and electrode pads 23 are formed at predetermined positions on the active layer 22. This state is shown in FIG. 7(a). Thereafter, a passivation film (not shown) is formed on the resulting wafer W so as to expose the electrode pads 23.

Figure 7B:
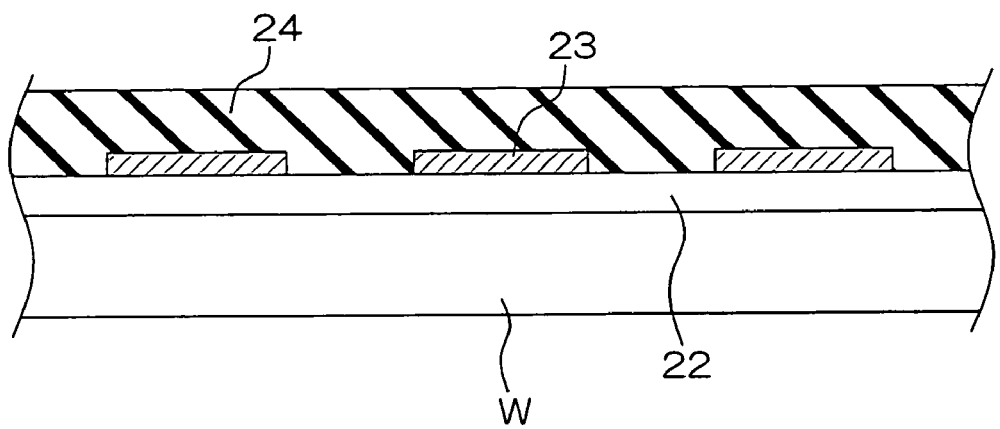
Figure 7C:
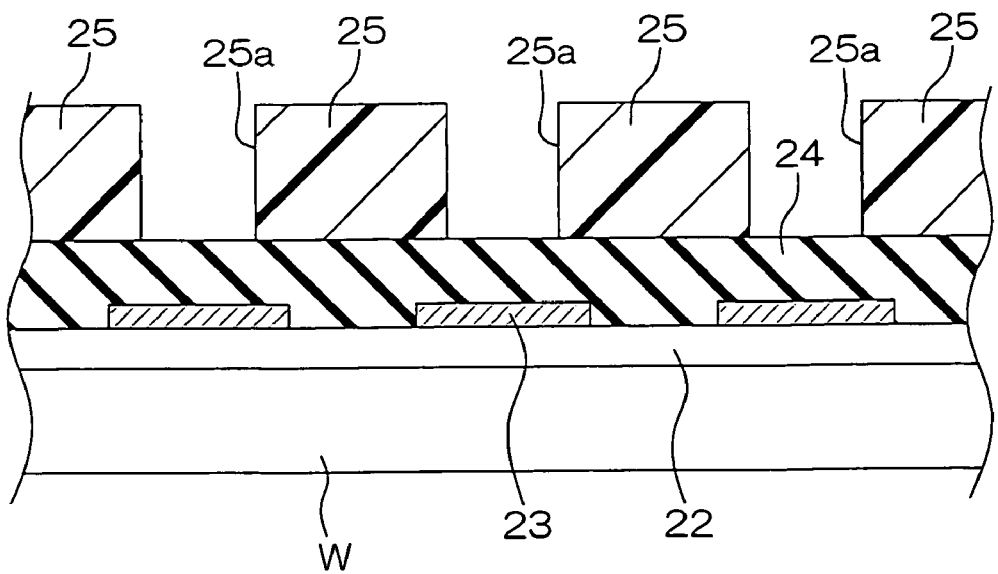

In turn, a stopper mask layer 24 of an insulative material such as silicon oxide or silicon nitride is formed on the entire surface of the resulting wafer W on the side of the active layer 22 by chemical vapor deposition or the like. The stopper mask layer 24 has an elastic modulus of not smaller than 1.5 GPa. If the resulting stopper mask layer 24 has a poor surface planarity, the surface of the stopper mask layer 24 is planarized by CMP. This state is shown in FIG. 7(b).

Subsequently, a resist film (photoresist) 25 is formed over the stopper mask layer 24, and apertures 25a for etching are formed in the resist film 25 by removing portions of the resist film 25 located above the electrode pads 23 by photolithography. The etching apertures 25a each have a width, for example, which is smaller than the width of the electrode pads 23 and greater than the width of portions of the electrode pads 23 exposed from the passivation film (not shown) (see FIG. 7(c)). However, the width of the etching apertures 25a is not limited to that defined above.

Figure 8D:
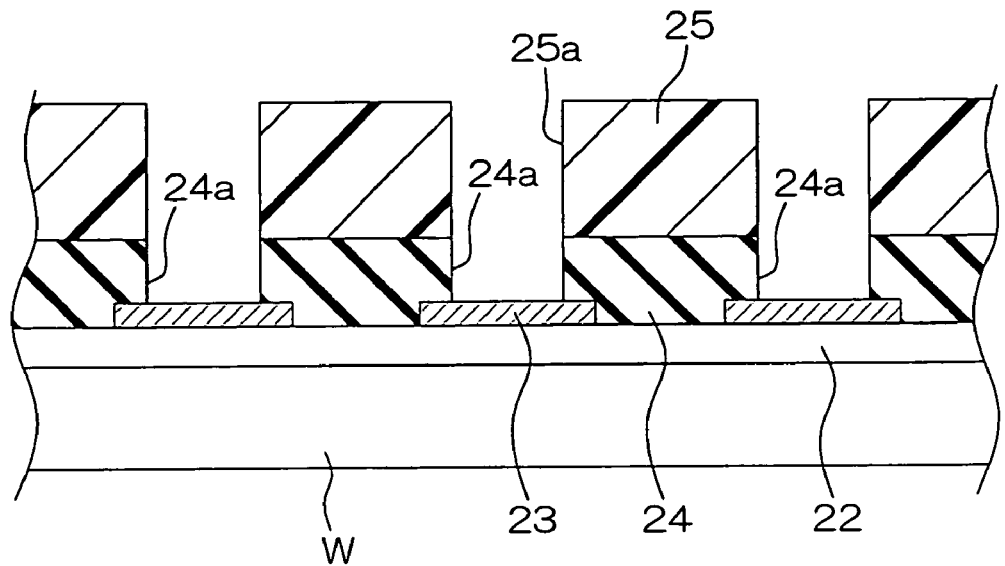
FIGS. 8(*d*), 8(*e*) and 8(*f*) are schematic sectional views for explaining the production method for the semiconductor device shown in FIG. 6.

Thereafter, the stopper mask layer 24 is etched through the etching apertures 25a of the resist film 25. Thus, the stopper mask layer 24 is formed with openings 24a which are respectively continuous to the etching apertures 25a of the resist film 25. The electrode pads 23 are exposed from bottom portions of the openings 24a. This step preferably employs a dry etching process. In this case, the openings 24a have interior side walls generally perpendicular to the wafer W as shown in FIG. 8(d).

Figure 8E:
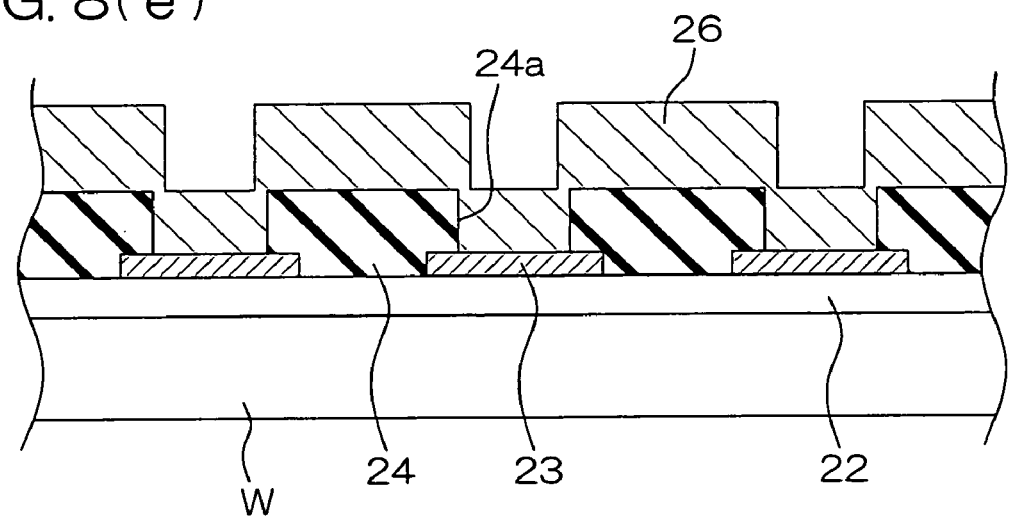

After the resist film 25 is removed, a metal film 26 of a metal (e.g., gold) is formed on the surface of the resulting wafer W on the active layer 22 side to completely fill the openings 24a with the metal by chemical vapor deposition or electrolytic plating. Where the formation of the metal film 26 is achieved by the plating, an electrically conductive seed layer is preliminarily formed on the surface of the wafer W on the active layer 22 side. Particularly, where the formation of the metal film 26 is achieve by the chemical vapor deposition, the metal film 26 is also deposited on the stopper mask layer 24 as shown in FIG. 8(e).

Figure 8F:
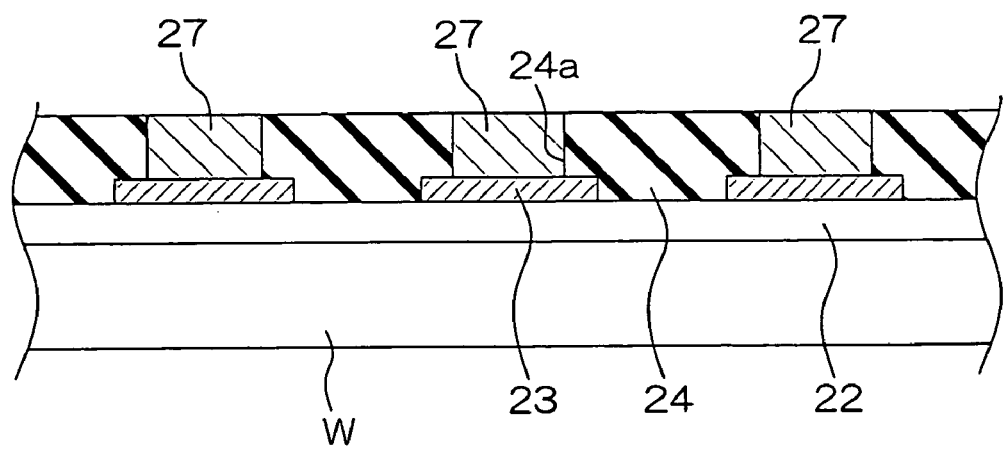

In turn, the surface of the metal film 26 formed on the wafer W is polished by CMP, whereby a portion of the metal film 26 present outside the openings 24a is removed. Thus, a continuous and flat surface is defined by the surface of the stopper mask layer 24 and the surfaces of metal film portions 26 left in the openings 24a as shown in FIG. 8(f). Where the formation of the metal film 26 is achieved by the plating, the metal film 26 grows in each of the openings 24a in conformity with the sectional shape of the seed layer serving as a base, and often has a recessed center portion. Even in this case, the surface of the metal film 26 is properly planarized by the polishing. The metal film portions 26 left in the openings 24a serve as projection electrodes 27 bonded to the electrode pads 23.

Where the stopper mask layer 24 is composed of silicon oxide, for example, the stopper mask layer 24 is harder than the metal film 26. Therefore, the removal of the stopper mask layer 24 can be suppressed after the portion of the metal film 26 present on the stopper mask layer 24 is removed by the CMP. That is, a difference in hardness between the stopper mask layer 24 and the metal film 26 makes it possible to selectively remove the portion of the metal film 26 present on the stopper mask layer 24.

In turn, the stopper mask layer 24 is partly removed by a predetermined thickness (e.g., one half the thickness of the projection electrodes 27) by dry etching or wet etching. The remaining portion of the stopper mask layer 24 serves as a protective film 21. In this step, an etching liquid more corrosive to the stopper mask layer 24 than to the projection electrodes 27 is employed so as to suppress the etching of the projection electrodes 27. Thus, the distal portions of the projection electrodes 27 project from the protective film 21.

Thereafter, the wafer W is diced into pieces of the semiconductor substrate 28. Thus, the semiconductor device 20 shown in FIG. 6 is provided.

In the semiconductor device production method described above, the stopper mask layer 24 of silicon oxide is harder than the resist film (photoresist) 105 employed in the conventional production method (see FIGS. 26(b) and 26(c)). The resist film 105 employed in the conventional production method has an elastic modulus of about 1 GPa. Therefore, the stopper mask layer 24 having an elastic modulus of not smaller than 1.5 GPa is less liable to be deformed than the resist film 105 when the same force is exerted thereon.

Therefore, when the metal film 26 is formed, the side faces of the metal film portions 26 extending along the side walls of the openings 24a are generally perpendicular to the wafer W in conformity with the initial shape of the openings 24a. Hence, the projection electrodes 27 have side faces generally perpendicular to the wafer W (or straight side faces). That is, there is no possibility that the projection electrodes 27 each have a width progressively increased toward the distal end thereof during the growth thereof and an inverted trapezoidal section like the projection electrodes 106 formed by the conventional production method (see FIG. 26(d)).

Even if the projection electrodes 27 are designed so as to be arranged at a reduced interval (or at a reduced pitch), the distal ends of the adjacent projection electrodes 27 are not easily brought into contact with each other nor electrically short-circuited. That is, this production method makes it possible to produce a semiconductor device 20 having projection electrodes 27 arranged at a reduced pitch.

The polishing of the metal film 26 by the CMP ensures that the surfaces of the metal film portions 26 left after the polishing (i.e., the distal end faces of the projection electrodes 27) are located within one flat plane (within the same plane). This is true even if the wafer W has a poor surface planarity. Therefore, the semiconductor device 20 having such projection electrodes 27 can properly be bonded to electrode pads provided on a wiring board.

Where the formation of the metal film 26 is achieved by the chemical vapor deposition or the sputtering, there is a wide choice of metal materials for the projection electrodes 27 as in the first embodiment.

The stopper mask layer 24 may be composed of a photosensitive resin. In this case, the openings 24a can be formed in the stopper mask layer 24 in the following manner. First, the photosensitive stopper mask layer 24 or its precursor layer is formed on the entire surface of the wafer W formed with the electrode pads 23 (see FIG. 7(a)).

The stopper mask layer 24 may be composed, for example, of a positive-type photoresist material. In this case, the stopper mask layer 24 is exposed to light through a mask having apertures formed at the same positions as those formed in the resist film 25 shown in FIG. 7(c) (above the electrode pads 23). Thereafter, the stopper mask layer 24 is etched (developed) by employing a proper etching liquid. Thus, the stopper mask layer 24 formed with the openings 24a as shown in FIGS. 8(d) to 8(f) is provided.

The stopper mask layer 24 may be composed, for example, of a negative-type photoresist material. In this case, the precursor layer of the stopper mask layer 24 is exposed to light through a mask having apertures and a non-aperture portion arranged in reverse relation to the resist film 25 shown in FIG. 7(c) and then developed. Thus, the stopper mask layer 24 formed with the openings 24a as shown in FIGS. 8(d) to 8(f) is provided. The stopper mask layer 24 may be composed of a photosensitive polyimide.

Figure 9:
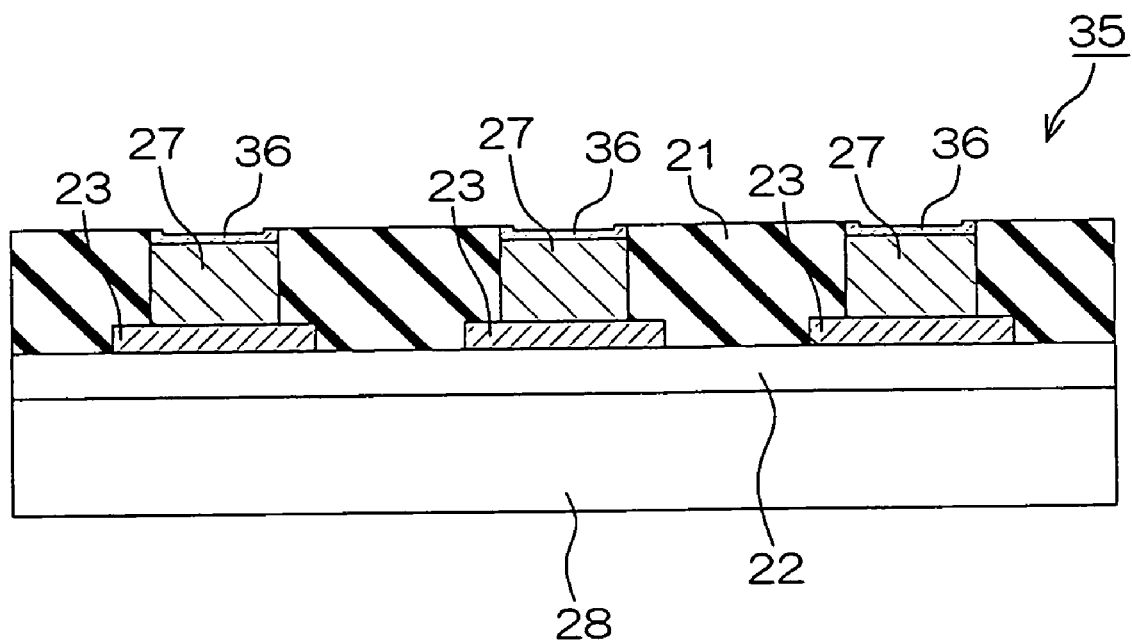
FIG. 9 is a schematic sectional view of a semiconductor device produced by a production method according to a modification of the second embodiment.

FIG. 9 is a schematic sectional view of a semiconductor device produced by a production method according to a modification of the second embodiment. In FIG. 9, components equivalent to those of the semiconductor device 20 shown in FIG. 6 are denoted by the same reference characters as in FIG. 6, and no explanation will be given thereto.

In the semiconductor device 35, thin layers 36 of a low melting point metal such as tin, indium or an alloy of tin or indium are respectively provided on the distal end faces of the projection electrodes 27. Neither the low melting point metal layers 36 nor the distal ends of the projection electrodes 27 project from the protective film 21. The semiconductor device 35 can be connected, for example, to another semiconductor device (chip) having projection electrodes provided in association with the projection electrodes 27 for chip-on-chip connection by melting and solidifying the low melting point metal layers 36.

Figure 10G:
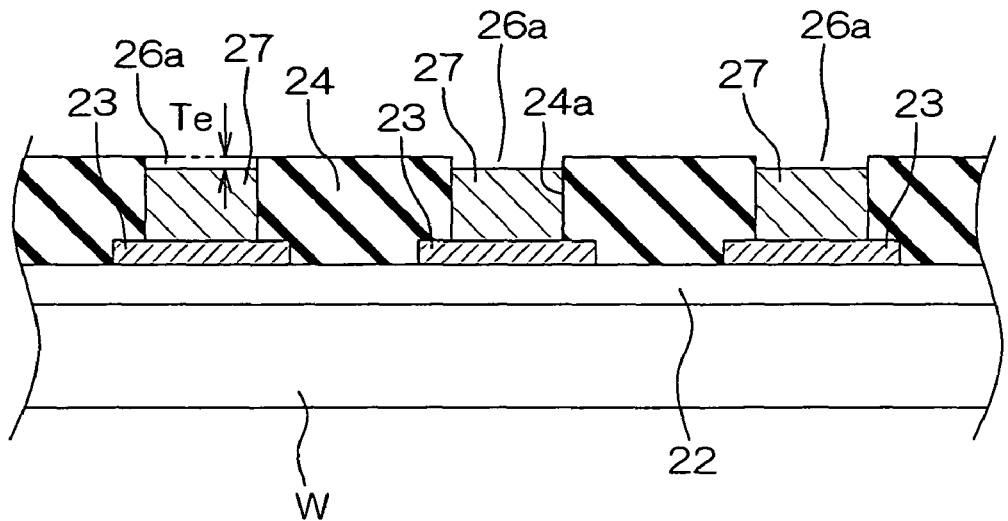
FIGS. 10(*g*), 10(*h*) and 10(*i*) are schematic sectional views for explaining the production method for the semiconductor device shown in FIG. 9.
Figure 10H:
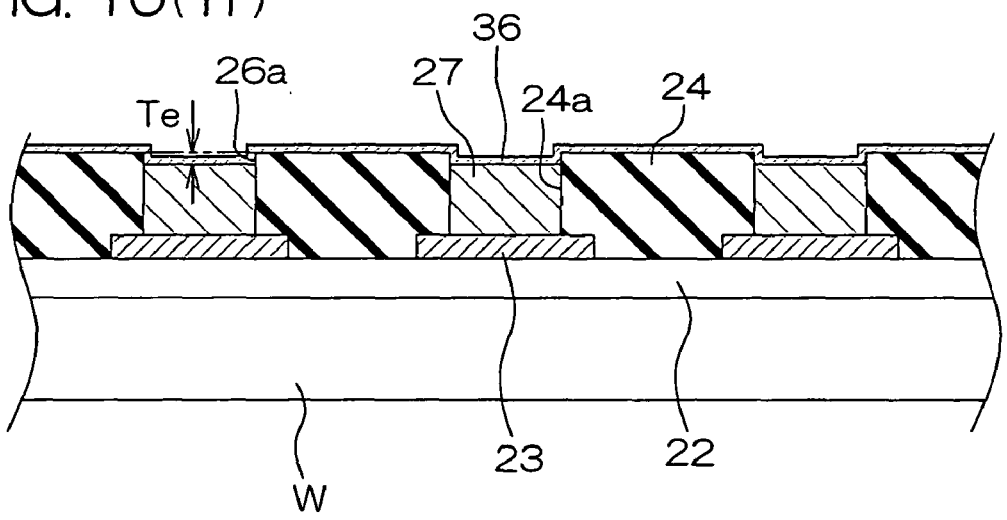
Figure 10I:
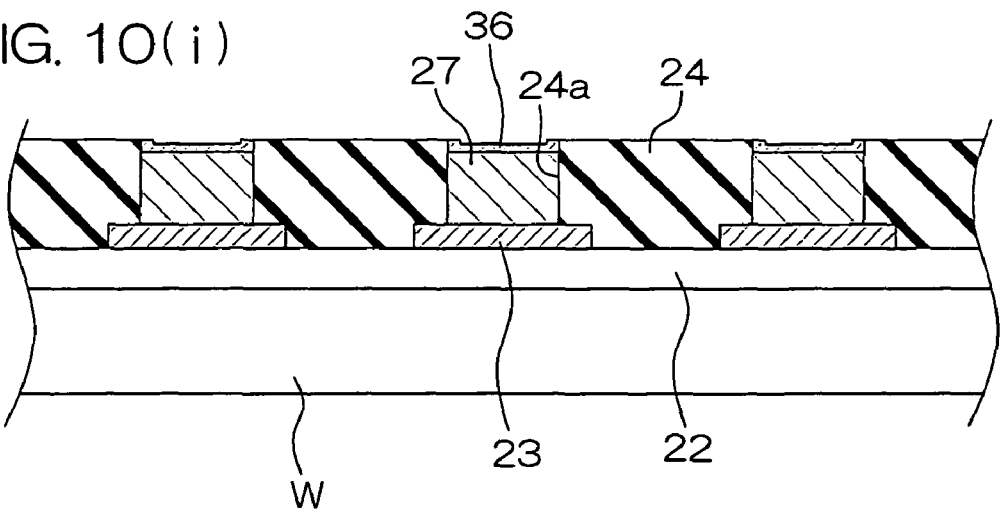

FIGS. 10(g), 10(h) and 10(i) are schematic sectional views for explaining the production method for the semiconductor device 35 shown in FIG. 9. In FIGS. 10(g), 10(h) and 10(i), components equivalent to those of the wafer W shown in FIGS. 8(d), 8(e) and 8(f) are denoted by the same reference characters as in FIGS. 8(d), 8(e) and 8(f), and no explanation will be given thereto.

The projection electrodes 27 formed on the wafer W (see FIG. 8(f)) by the polishing of the metal film 26 by the CMP by the production method according to the second embodiment are dry-etched or wet-etched so as to be partly removed by a predetermined etch-back thickness Te. Thus, recesses 26a are formed in the surfaces of the stopper mask layer 24 and the projection electrodes 27 above the projection electrodes 27. This state is shown in FIG. 10(g).

Then, a low melting point metal layer 36 of a low melting point metal such as tin, indium or an alloy of tin or indium is formed on a surface of the resulting wafer W on the side of the active layer 22 by chemical vapor deposition, sputtering or the like. Thus, the low melting point metal layer 36 is provided on the surfaces of the stopper mask layer 24 and the projection electrodes 27 stepped by the recesses 26a. The thickness of the low melting point metal layer 36 may be smaller than the etch-back thickness Te (see FIG. 10(h)) or greater than the etch-back thickness Te. Where the thickness of the low melting point metal layer 36 is greater than the etch-back thickness Te, the formation of the low melting point metal layer 36 may be achieved by a dip method.

Subsequently, the low melting point metal layer 36 is polished (ground) until the stopper mask layer 24 is exposed. Thus, portions of the low melting point metal layer 36 are left only in the recesses 26a (see FIG. 10(i)).

Thereafter, the wafer W is diced into pieces of the semiconductor substrate 28. Thus, the semiconductor device 35 shown in FIG. 9 is provided.

Even where the stopper mask layer 24 is composed of an insulative material, the formation of the recesses 26a can be achieved in the same manner as in the case of the stopper mask layer 4 composed of the metal (see FIGS. 5(g), 5(h) and 5(i)) by properly selecting an etching medium and an etching method. The projection electrodes 27 having the low melting point metal layers 36 formed only on the distal end faces thereof can be provided by utilizing the recesses 26a.

The formation of the recesses 26a is achieved by the dry etching or the wet etching of the projection electrodes 27 (see FIG. 10(g)) but, instead, the supply of the metal material for the metal layer 26 may be stopped before the openings 24a are completely filled with the metal material in the step of forming the metal film 26 (see FIG. 8(e)). In this case, recesses as shown in FIG. 10(g) are provided by removing a portion of the metal film 26 present outside the openings 24a by the CMP.

FIG. 11 is a schematic sectional view of a semiconductor device produced by a production method according to a third embodiment of the present invention.

The semiconductor device 40 includes a semiconductor substrate 48 not packaged, and is capable of so-called flip-chip connection. An active layer 42 including a functional device and interconnections is provided in one surface of the semiconductor substrate 48, and electrode pads and interconnections (hereinafter referred to generally as "electrode pads") 43 electrically connected to the functional device in the active layer 42 are provided at predetermined positions on the active layer 42. A passivation film (not shown) for protecting the active layer 42 is provided on the active layer 42 with the electrode pads 43 exposed therefrom.

Column-shaped projection electrodes 47 respectively project from the electrode pads 43. The projection electrodes 47 and the electrode pads 43 may be composed of the same material or different materials. The projection electrodes 47 are composed, for example, of gold. Thin barrier metal layers 41 are respectively provided between the electrode pads 43 and the projection electrodes 47. Thus, diffusion of a metal element across the barrier metal layer 41 is prevented, so that the electrode pads 43 and the active layer 42 are protected. The semiconductor device 40 can be connected to a wiring board with the projection electrodes 47 thereof being bonded to electrode pads provided on the wiring board for flip-chip connection.

FIGS. 12(a), 12(b) and 12(c) and FIGS. 13(d), 13(e) and 13(f) are schematic sectional views for explaining the production method for the semiconductor device 40 shown in FIG. 11.

Figure 12A:
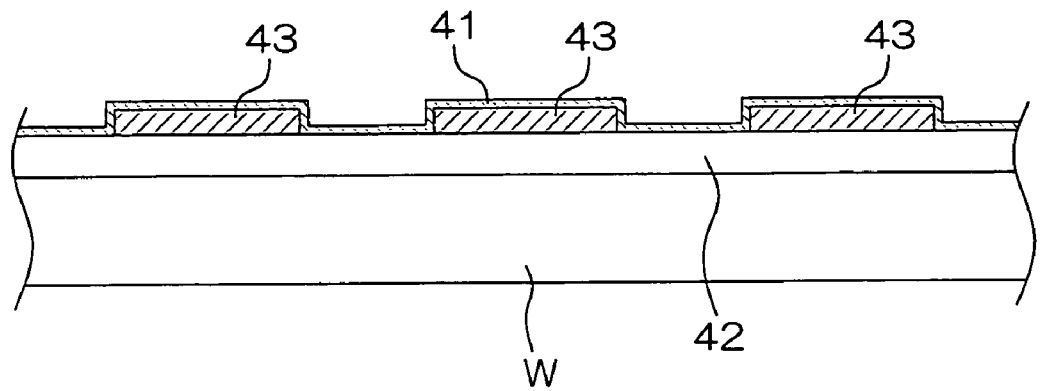
FIGS. 12(a), 12(b) and 12(c) are schematic sectional views for explaining the production method for the semiconductor device shown in FIG. 11.

First, an active layer 42 including a functional device and interconnections is formed in one surface of a preliminarily planarized semiconductor wafer W, and electrode pads 43 are formed at predetermined positions on the active layer 42. Then, a passivation film (not shown) is formed on the resulting wafer W so as to expose the electrode pads 43. Further, a thin barrier metal layer 41 is formed on the entire surface of the resulting wafer W on the side of the active layer 42. This state is shown in FIG. 12(a).

The barrier metal layer 41 is preferably composed of a metal having higher adhesion to the electrode pads 43 and the projection electrodes 47. Where the projection electrodes 47 are formed of gold (Au), for example, the barrier metal layer 41 may be formed of titanium-tungsten (TiW)

In turn, a stopper mask layer 44 of a metal such as chromium is formed on the entire surface of the resulting wafer W on the active layer 42 side by electrolytic plating, chemical vapor deposition or the like. Where the formation of the stopper mask layer 44 is achieved by the electrolytic plating, the barrier metal layer 41 serves as a seed layer, and metal atoms are deposited on the barrier metal layer 41 to form the stopper mask layer 44.

Figure 12B:
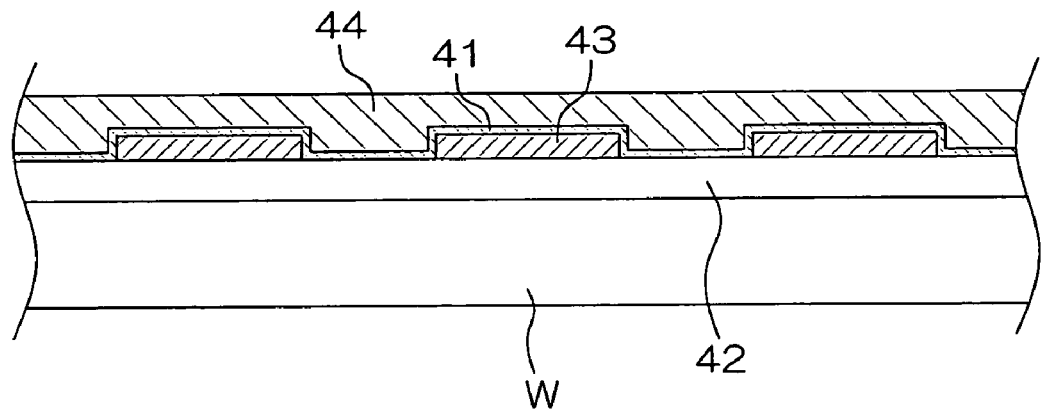
Figure 12C:
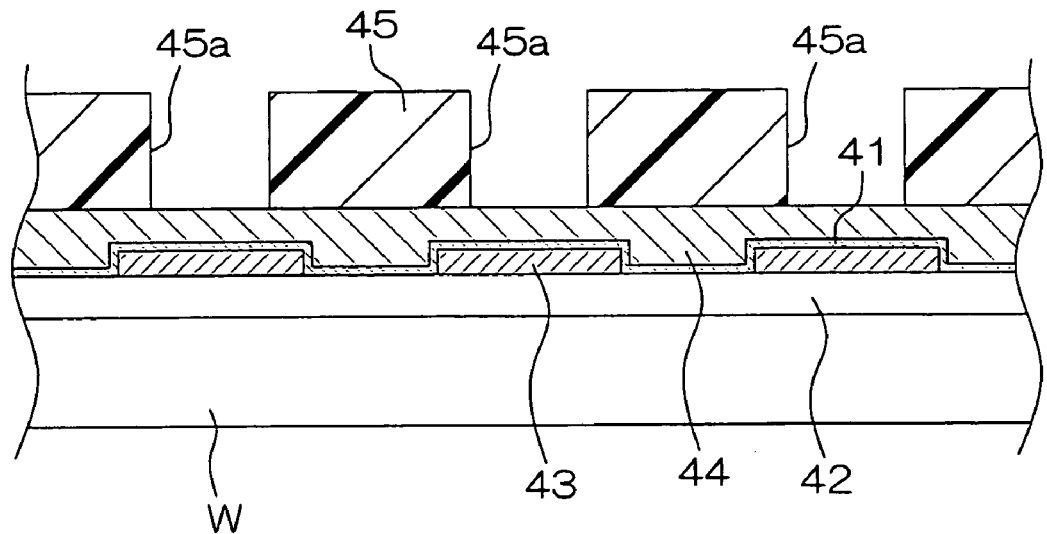

If the resulting stopper mask layer 44 has a poor surface planarity, the surface of the stopper mask layer 44 is planarized by CMP (see FIG. 12(b)).

Subsequently, a resist film (photoresist) 45 is formed over the stopper mask layer 44, and apertures 45a for etching are formed in the resist film 45 by removing portions of the resist film 45 located above the electrode pads 43 by photolithography. The etching apertures 45a each have a width, for example, which is smaller than the width of the electrode pads 43 and greater than the width of portions of the electrode pads 43 exposed from the passivation film (not shown) (see FIG. 12(c)). However, the width of the etching apertures 45a is not limited to that defined above.

Figure 13D:
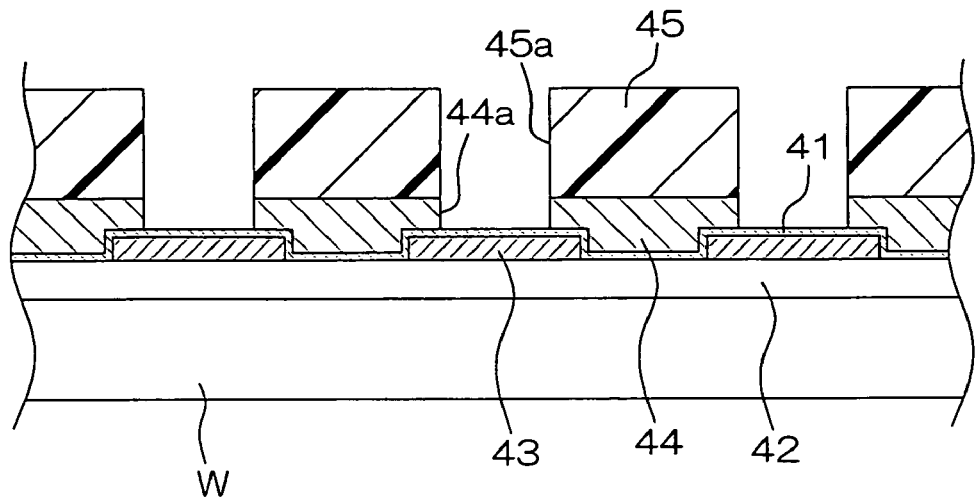
FIGS. 13(d), 13(e) and 13(f) are schematic sectional views for explaining the production method for the semiconductor device shown in FIG. 11.

Thereafter, the stopper mask layer 44 is etched through the etching apertures 45a of the resist film 45. Thus, the stopper mask layer 44 is formed with openings 44a which are respectively continuous to the etching apertures 45a of the resist film 45. The barrier metal layer 41 is partly exposed from bottom portions of the openings 44a. This step preferably employs anisotropic dry etching. In this case, the openings 44a have interior side walls generally perpendicular to the wafer W as shown in FIG. 13(d).

Figure 13E:
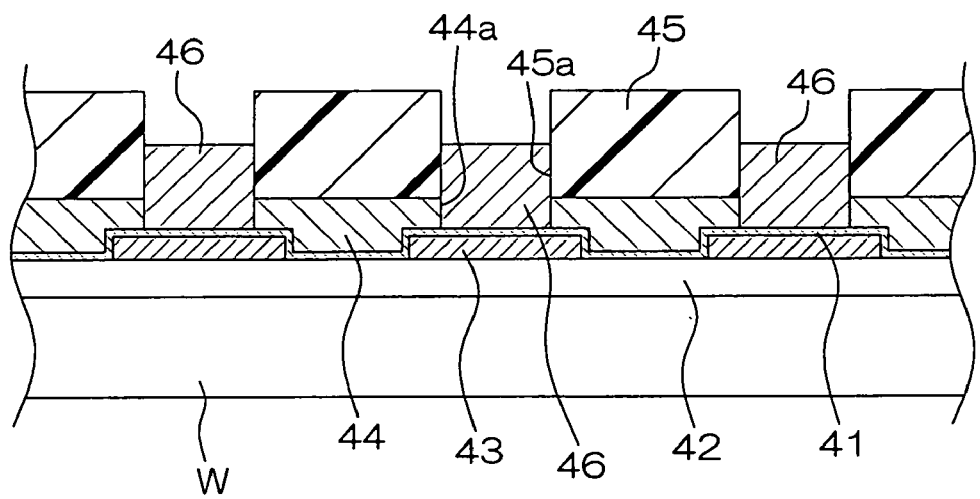

Subsequently, metal films 46 such as of gold are formed in the openings 44a and the etching apertures 45a by electrolytic plating. At this time, an electric current is applied to a plating liquid via the barrier metal layer 41, whereby the metal films 46 grow on the barrier metal layer 41. That is, the metal films 46 fill the openings 44a and the apertures 45a from the side of the barrier metal layer 41. The formation of the metal films 46 is stopped before the etching apertures 45a are completely filled after the openings 44a are completely filled. Thus, the metal films 46 are present only within the openings 44a and the etching apertures 45a as shown in FIG. 13(e).

Thereafter, the surface of the wafer W formed with the metal films 46 is polished (ground) by CMP, whereby portions of the metal films 46 projecting from the surface of the stopper mask layer 44 are removed. The polishing of the metal films 46 may be carried out after the resist film 45 is preliminarily removed. Alternatively, the polishing of the metal films 46 may be carried out in the presence of the resist film 45, so that the metal films 46 and the resist film 45 are simultaneously removed.

Figure 13F:
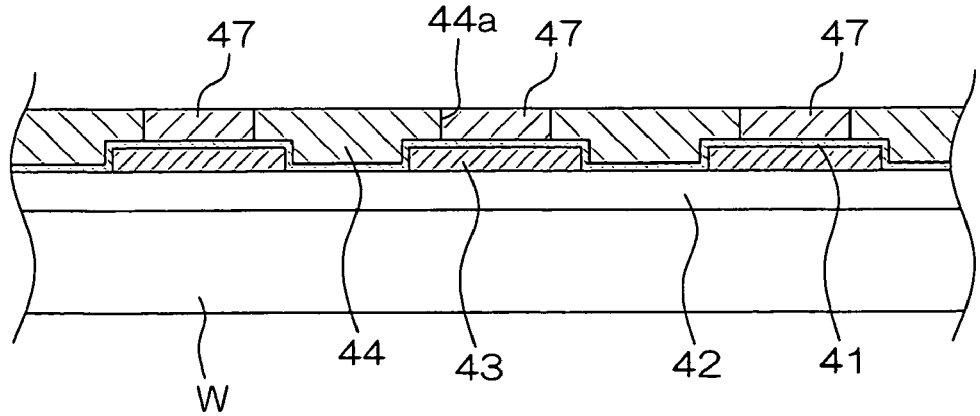

Thus, a continuous and flat surface is defined by the surface of the stopper mask layer 44 and the surfaces of the metal films 46 (see FIG. 13(f)). Where the stopper mask layer 44 has a higher hardness than the metal films 46, virtually only the portions of the metal films 46 projecting from the surface of the stopper mask layer 44 can selectively be removed. Remaining portions of the metal films 46 serve as the projection electrodes 47.

In turn, the stopper mask layer 44 is etched away by utilizing a difference in etching rate between the stopper mask layer 44 and the projection electrodes 47. Further, a portion of the barrier metal layer 41 exposed after the removal of the stopper mask layer 44 is removed. Thus, the barrier metal layer 41 is left only between the electrode pads 43 and the metal films 46. The projection electrodes 47 project from the surface of the wafer W (electrode pads 43). Thereafter, the wafer W is diced into pieces of the semiconductor substrate 48. Thus, the semiconductor device 40 shown in FIG. 11 is provided.

In the semiconductor device production method described above, the step of forming the metal films 46 is significantly different from that in the first and second embodiments. That is, the formation of the metal film 6, 26 follows the removal of the resist film 5, 25 in the first and second embodiments (see FIG. 3(e) and FIG. 8(e)), while the metal films 46 are formed in the presence of the resist film 45 in this embodiment (see FIG. 13(e)).

The metal film 6, 26 is extensively formed even outside the openings 4a, 24a (on the stopper mask layer 4, 24) in the first and second embodiments, while the metal films 46 are respectively formed in the etching apertures 45a besides the openings 44a in this embodiment. That is, the amount of the metal film(s) 6, 26, 46 formed outside the openings 4a, 24a, 44a is much smaller in this embodiment than in the first and second embodiments.

Accordingly, the amount of the metal film(s) 6, 26, 46 partly removed by the polishing (grinding) is smaller in this embodiment than in the first and second embodiments. Therefore, where the metal films 46 are formed of expensive gold as in this embodiment, the amount of gold wasted by the polishing is reduced, thereby reducing the costs.

In this embodiment, the surfaces of the metal films 46 are located within substantially the same plane by the polishing as in the first and second embodiments. Therefore, the projection electrodes 47 are uniform in height, so that the distal end faces thereof are located within substantially the same plane.

Although the formation of the metal films 46 is achieved by the electrolytic plating in this embodiment, an electroless plating process may be employed.

In this embodiment, the barrier metal layer 41 is formed over the active layer 42 and the electrode pads 43 before the formation of the stopper mask layer 44. However, barrier metal layers 41 may respectively be formed only on the electrode pads 43 exposed within the openings 44a after the formation of the openings 44a in the stopper mask layer 44. In this case, the formation of the stopper mask layer 44 may be achieved by CVD, and the formation of the barrier metal layers 41 may be achieved by plating.

In this production method, the barrier metal layers 41 are initially formed only on the electrode pads 43. Even where the semiconductor device is produced by forming a stopper mask layer 44 of an insulative material and leaving the stopper mask layer 44 (without completely removing the stopper mask layer 44), the electrode pads 43 are prevented from being short-circuited by the barrier metal layers 41.

Figure 14:
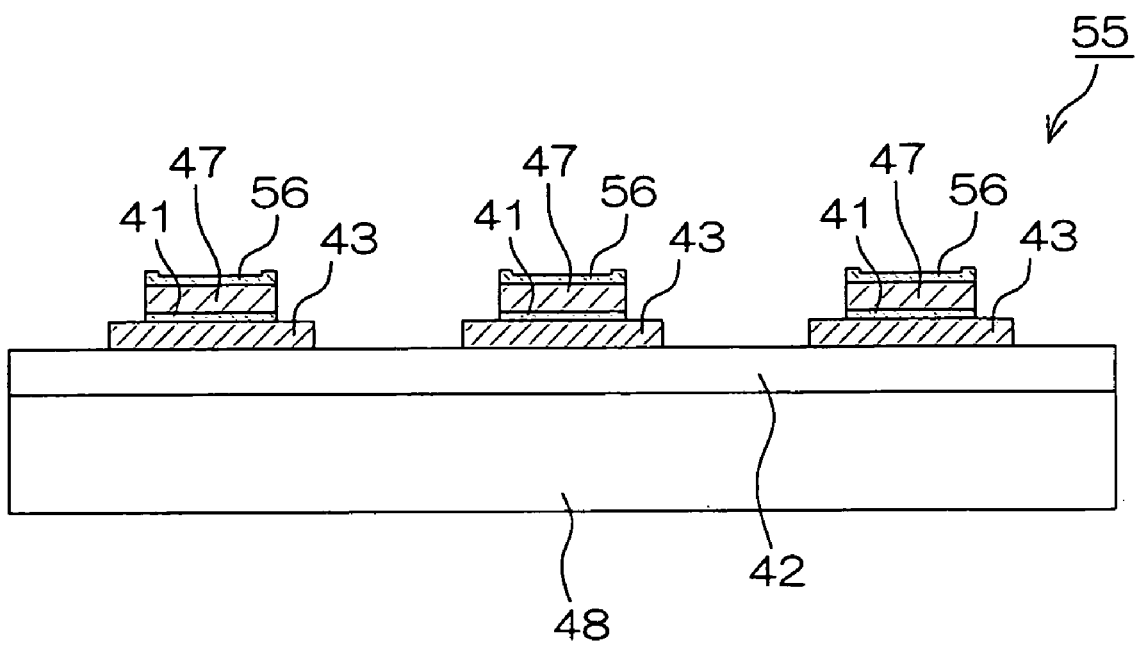
FIG. 14 is a schematic sectional view of a semiconductor device produced by a production method according to a modification of the third embodiment.

FIG. 14 is a schematic sectional view of a semiconductor device produced by a production method according to a modification of the third embodiment. In FIG. 14, components equivalent to those of the semiconductor device 40 shown in FIG. 11 are denoted by the same reference characters as in FIG. 11, and no explanation will be given thereto.

In the semiconductor device 55, thin layers 56 of a low melting point metal such as tin, indium or an alloy of tin or indium are respectively provided on the distal end faces of the projection electrodes 47. The semiconductor device 55 can be connected to electrode pads provided on a wiring board for flip-chip connection by melting and solidifying the low melting point metal layers 56.

Figure 15G:
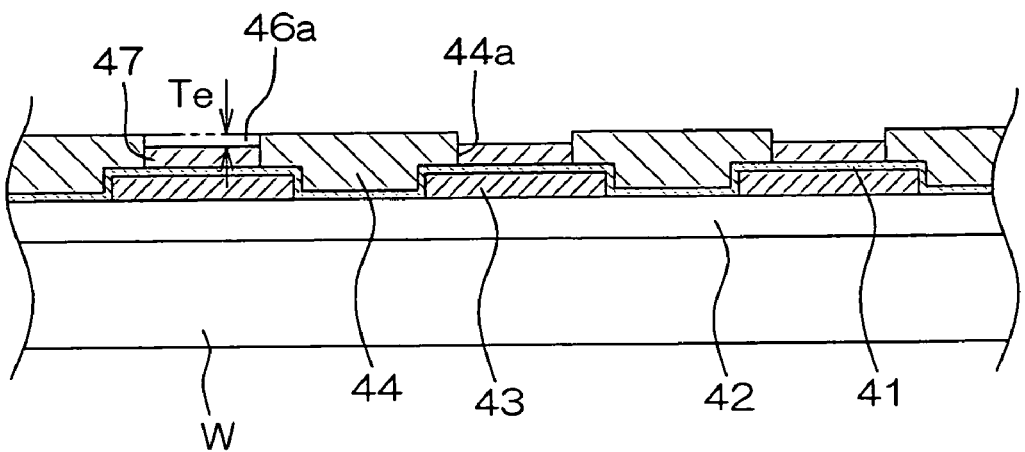
FIGS. 15(g), 15(h) and 15(i) are schematic sectional views for explaining the production method for the semiconductor device shown in FIG. 14.
Figure 15H:
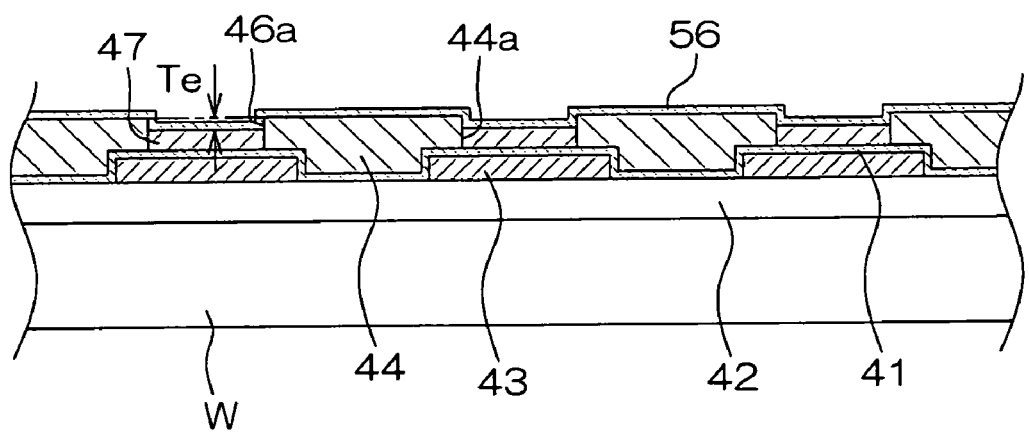
Figure 15I:
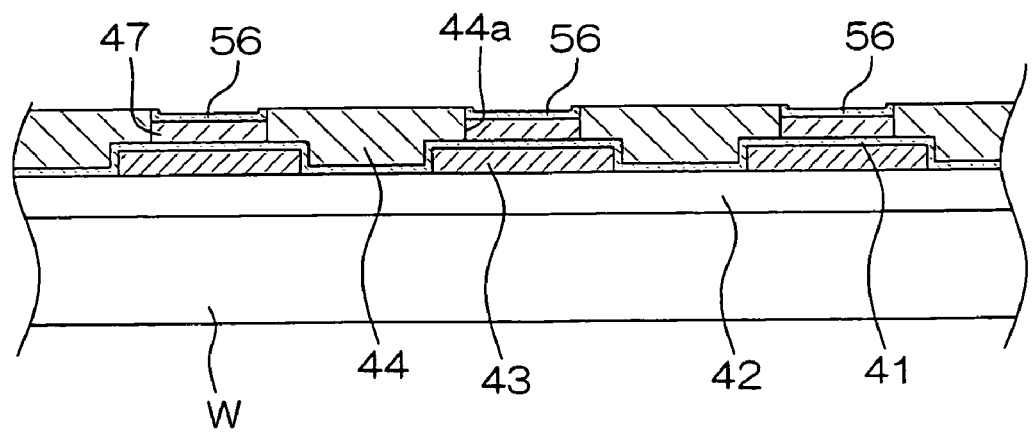

FIGS. 15(g), 15(h) and 15(i) are schematic sectional views for explaining the production method for the semiconductor device 55 shown in FIG. 14. In FIGS. 15(g), 15(h) and 15(i), components equivalent to those of the wafer W shown in FIGS. 13(d), 13(e) and 13(f) are denoted by the same reference characters as in FIGS. 13(d), 13(e) and 13(f), and no explanation will be given thereto.

The projection electrodes 47 formed on the wafer W (see FIG. 13(f)) by the polishing of the metal films 46 by the CMP by the production method according to the third embodiment are dry-etched or wet-etched so as to be partly removed by a predetermined etch-back thickness Te. Thus, recesses 46a are formed in the surface of the stopper mask layer 44 and the surfaces of the projection electrodes 47 above the projection electrodes 47. This state is shown in FIG. 15(g).

Then, a low melting point metal layer 56 of a low melting point metal such as tin, indium or an alloy of tin or indium is formed on a surface of the resulting wafer W on the side of the active layer 42 by chemical vapor deposition or sputtering. Thus, the low melting point metal layer 56 is provided on the surface of the stopper mask layer 44 and the surfaces of the projection electrodes 47 stepped by the recesses 46a. The thickness of the low melting point metal layer 56 may be smaller than the etch-back thickness Te (see FIG. 15(h)) or greater than the etch-back thickness Te. Where the thickness of the low melting point metal layer 56 is greater than the etch-back thickness Te, the formation of the low melting point metal layer 56 may be achieved by a dip method.

Subsequently, the low melting point metal layer 56 is polished (ground) until the stopper mask layer 44 is exposed. Thus, portions of the low melting point metal layer 56 are left only in the recesses 46a (see FIG. 15(i)).

Then, the stopper mask layer 44 is removed, and a portion of the barrier metal layer 41 exposed after the removal of the stopper mask layer 44 is removed. Thus, the barrier metal layer 41 is left only between the electrode pads 43 and the projection electrodes 47. The projection electrodes 47 project from the surface of the wafer W (electrode pads 43). Thereafter, the wafer W is diced into pieces of the semiconductor substrate 48. Thus, the semiconductor device 55 shown in FIG. 14 is provided.

Figure 16:
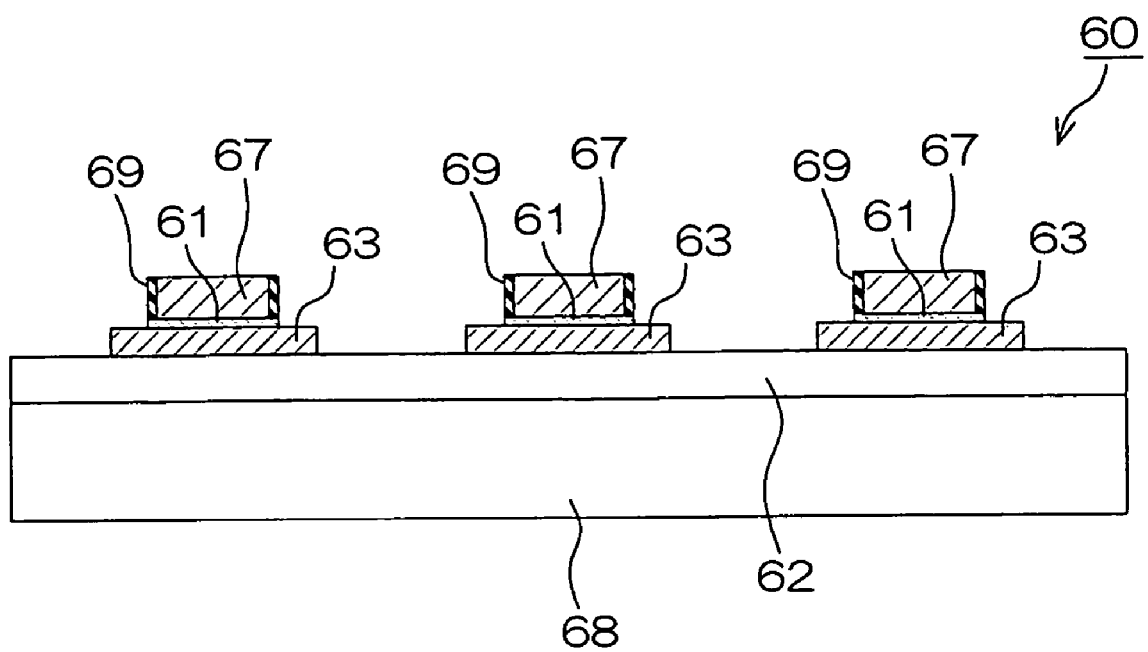
FIG. 16 is a schematic sectional view of a semiconductor device produced by a production method according to a fourth embodiment of the present invention.

FIG. 16 is a schematic sectional view of a semiconductor device produced by a production method according to a fourth embodiment of the present invention.

The semiconductor device 60 includes a semiconductor substrate 68 not packaged, and is capable of so-called flip-chip connection. An active layer 62 including a functional device and interconnections is provided in one surface of the semiconductor substrate 68, and electrode pads and interconnections (hereinafter referred to generally as "electrode pads") 63 electrically connected to the functional device in the active layer 62 are provided at predetermined positions on the active layer 62. A passivation film (not shown) for protecting the active layer 62 is provided on the active layer 62 with the electrode pads 63 exposed therefrom.

Column-shaped projection electrodes 67 respectively project from the electrode pads 63. The projection electrodes 67 are composed of a metal material such as gold. Thin barrier metal layers (UBM) 61 are respectively provided between the electrode pads 63 and the projection electrodes 67. Thus, diffusion of the metal element across the barrier metal layer 61 is prevented, so that the electrode pads 63 and the active layer 62 are protected. The semiconductor device 60 is connected to a wiring board with the projection electrodes 67 thereof being bonded to electrode pads provided on the wiring board for flip-chip connection.

Diffusion prevention films 69 of an oxide or a nitride are provided on side faces of the projection electrodes 67.

FIGS. 17(a), 17(b) and 17(c) and FIGS. 18(d), 18(e) and 18(f) are schematic sectional views for explaining the production method for the semiconductor device 60 shown in FIG. 16.

Figure 17A:
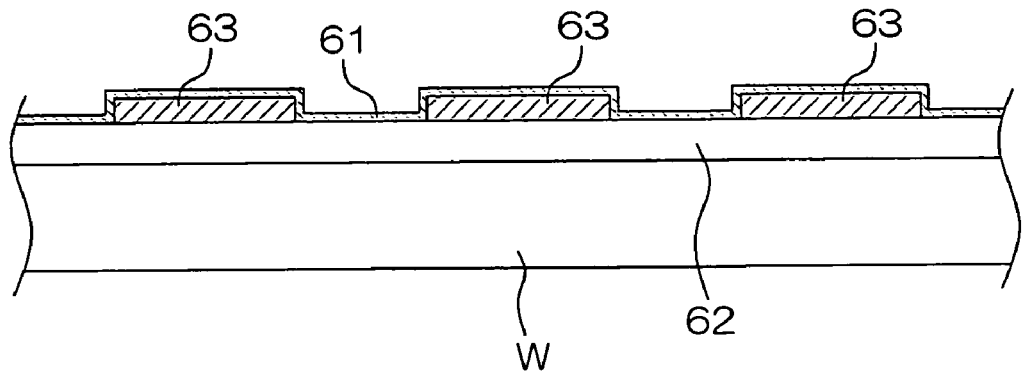
FIGS. 17(a), 17(b) and 17(c) are schematic sectional views for explaining the production method for the semiconductor device shown in FIG. 16.

First, an active layer 62 including a functional device and interconnections is formed in one surface of a preliminarily planarized semiconductor wafer W, and electrode pads 63 are formed at predetermined positions on the active layer 62. Thereafter, a passivation film (not shown) is formed on the resulting wafer W so as to expose the electrode pads 63. Further, a thin barrier metal layer 61 is formed on the entire surface of the resulting wafer W on the side of the active layer 62. This state is shown in FIG. 17(a).

In turn, a stopper mask layer 64 of a metal such as chromium is formed on the entire surface of the resulting wafer W on the active layer 62 side by electrolytic plating, chemical vapor deposition or the like. Where the formation of the stopper mask layer 64 is achieved by the electrolytic plating, the barrier metal layer 61 serves as a seed layer, and metal atoms are deposited on the barrier metal layer 61 to form the stopper mask layer 64.

Figure 17B:
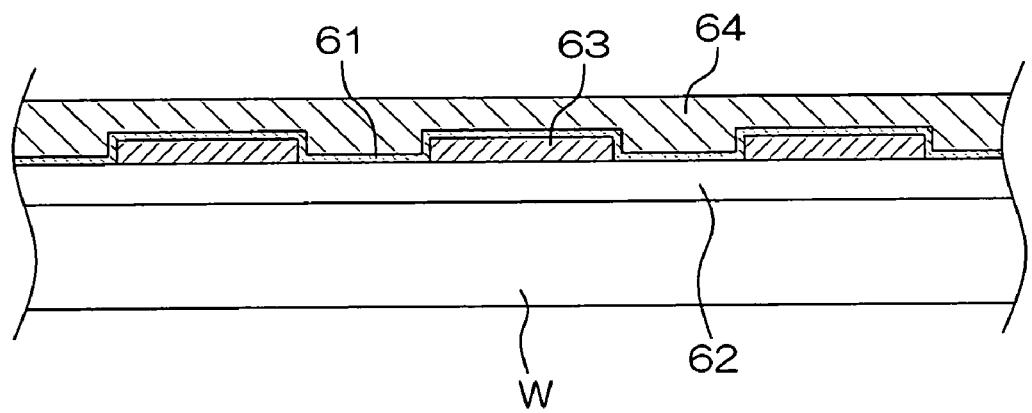
Figure 17C:
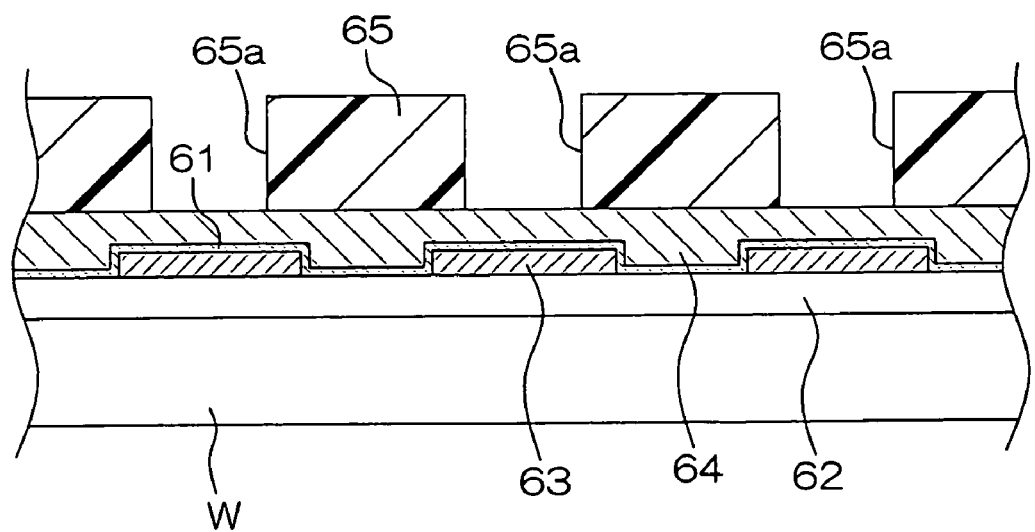

If the resulting stopper mask layer 64 has an uneven thickness or has a poor surface planarity, the surface of the stopper mask layer 64 is planarized to an even thickness by CMP (see FIG. 17(b)).

Subsequently, a resist film (photoresist) 65 is formed over the stopper mask layer 64, and apertures 65a for etching are formed in the resist film 65 by removing portions of the resist film 65 located above the electrode pads 63 by photolithography. The etching apertures 65a each have a width, for example, which is smaller than the width of the electrode pads 63 and greater than the width of portions of the electrode pads 63 exposed from the passivation film (not shown) (see FIG. 17(c)). However, the width of the etching apertures 65a is not limited to that defined above.

Thereafter, the stopper mask layer 64 is etched through the etching apertures 65a of the resist film 65. Thus, the stopper mask layer 64 is formed with openings 64a which are respectively continuous to the etching apertures 65a of the resist film 65. The barrier metal layer 61 is partly exposed from bottom portions of the openings 64a. This step preferably employs an anisotropic dry etching process. In this case, the openings 64a have interior side walls generally perpendicular to the wafer W.

After the resist film 65 is removed, a diffusion prevention film 69 of an oxide, a nitride or a metal is formed on the exposed surfaces of the stopper mask layer 64 and the barrier metal layer 61 by CVD. Where the diffusion prevention film 69 is formed of the metal, the same metal material as that for the barrier metal layer 61 may be employed for the formation of the diffusion prevention film 69.

Figure 18D:
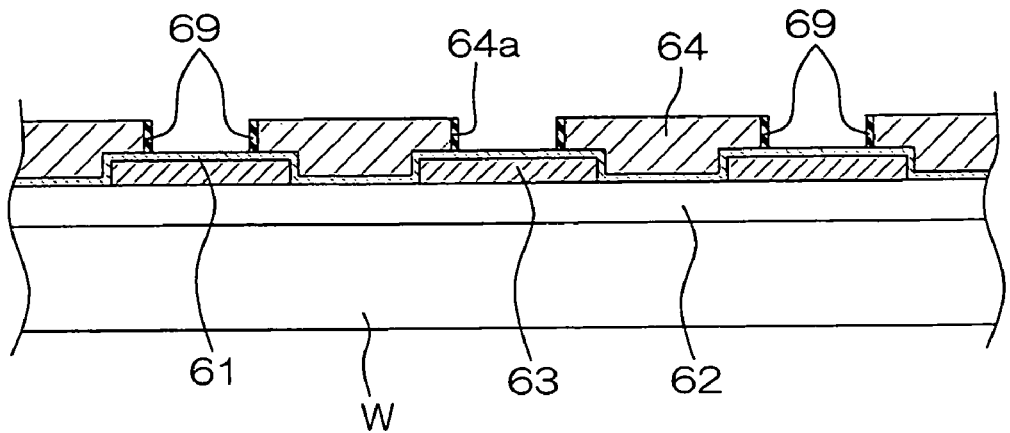
FIGS. 18(d), 18(e) and 18(f) are schematic sectional views for explaining the production method for the semiconductor device shown in FIG. 16.

Then, portions of the diffusion prevention film 69 present on the top of the stopper mask layer 64 and on the barrier metal layer 61 are removed by dry-etching (anisotropic etching). Thus, the resulting diffusion prevention films 69 are left only on interior side walls of the openings 64a. This state is shown in FIG. 18(d).

Subsequently, metal films 66 are formed in the openings 64a as completely filling the openings 64a. At this time, the barrier metal layer 61 serves as a seed layer, and the metal films 66 grow on the barrier metal layer 61. That is, the metal films 66 fill the openings 64a from the side of the barrier metal layer 61.

The metal films 66 grow, while being isolated from the stopper mask layer 64 by the diffusion prevention films 69. The metal element is less liable to diffuse into the diffusion prevention films 69 of the oxide or the nitride. Even if the metal element constituting the metal films 66 and the metal element constituting the stopper mask layer 64 are reactive with each other through diffusion, the metal films 66 and the stopper mask layer 64 do not react with each other. The metal films 66 are not deposited directly on the diffusion prevention films 69 from a plating liquid.

Even where the diffusion prevention films 69 are composed of the same metal material as the barrier metal layer 61, the diffusion of metal atoms between the metal films 66 and the stopper mask layer 64 is prevented by the diffusion prevention films 69.

Figure 18E:
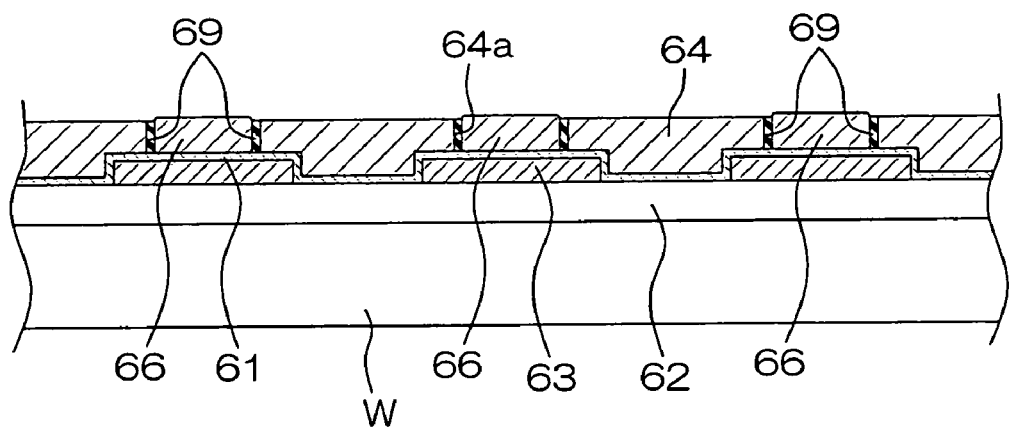
Figure 18F:
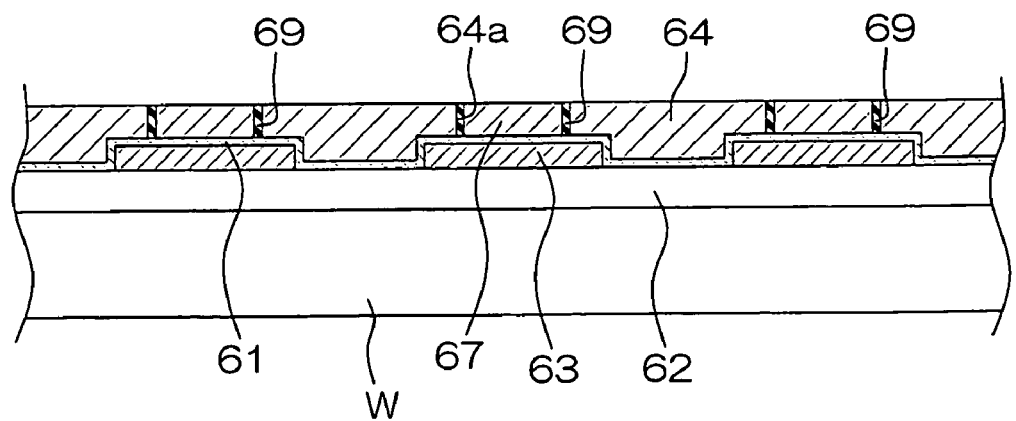

The formation of the metal films 66 is stopped before the metal films 66 grow outside the openings 64a after the openings 64a are completely filled with the metal films 66. This state is shown in FIG. 18(e).

In turn, the surface of the wafer W formed with the metal films 66 is polished (ground) by CMP, whereby portions of the diffusion prevention films 69 and the metal films 66 present outside the openings 64a are removed. Thus, a continuous and flat surface is defined by the surface of the stopper mask layer 64 and the surfaces of the metal films 66. The remaining portions of the metal films 66 serve as projection electrodes 67. The diffusion prevention films 69 are left only on the interior side walls of the openings 64a (see FIG. 18(f)).

In turn, the stopper mask layer 64 is removed by wet etching. Since the stopper mask layer 64 does not react with the metal films 66, only the stopper mask layer 64 can easily and selectively be removed. The projection electrodes 67 project from the surface of the wafer W (electrode pads 63). The side faces of the projection electrodes 67 are covered with the diffusion prevention films 69.

As required, the diffusion prevention films 69 may be removed. The removal of the diffusion prevention films 69 may be achieved, for example, by dry etching by supplying an etching medium obliquely with respect to the wafer W and causing the etching medium to impinge on the diffusion prevention films 69 on the side faces of the projection electrodes 67. Where the diffusion prevention films 69 are composed of the metal, the removal of the diffusion prevention films 69 can easily be achieved by a wet process.

Thereafter, the wafer W is diced into pieces of the semiconductor substrate 68. Thus, the semiconductor device 60 shown in FIG. 16 is provided.

Figure 19:
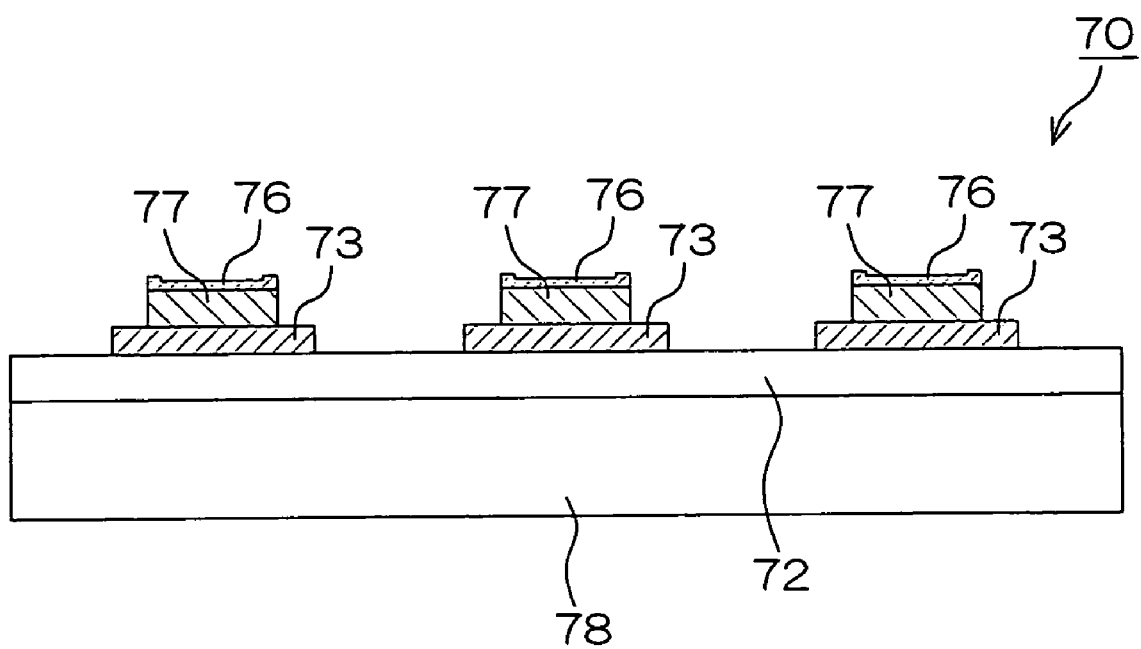
FIG. 19 is a schematic sectional view of a semiconductor device produced by a production method according to a fifth embodiment of the present invention.

FIG. 19 is a schematic sectional view of a semiconductor device produced by a production method according to a fifth embodiment of the present invention.

The semiconductor device 70 includes a semiconductor substrate 78 not packaged, and is capable of so-called flip-chip connection. An active layer 72 including a functional device and interconnections is provided in one surface of the semiconductor substrate 78, and electrode pads and interconnections (hereinafter referred to generally as "electrode pads") 73 electrically connected to the functional device in the active layer 72 are provided at predetermined positions on the active layer 72. A passivation film (not shown) for protecting the active layer 72 is provided on the active layer 72 with the electrode pads 73 exposed therefrom.

Column-shaped projection electrodes 77 respectively project from the electrode pads 73. Thin layers 76 of a low melting point metal such as tin, indium or an alloy of tin or indium are provided on distal end faces of the projection electrodes 77. The semiconductor device 70 can be connected to electrode pads provided on a wiring board for flip-chip connection by melting and solidifying the low melting point metal layers 76.

FIGS. 20(a), 20(b) and 20(c) and FIGS. 21(d), 21(e) and 21(f) are schematic sectional views for explaining the production method for the semiconductor device 70 shown in FIG. 19.

Figure 20A:
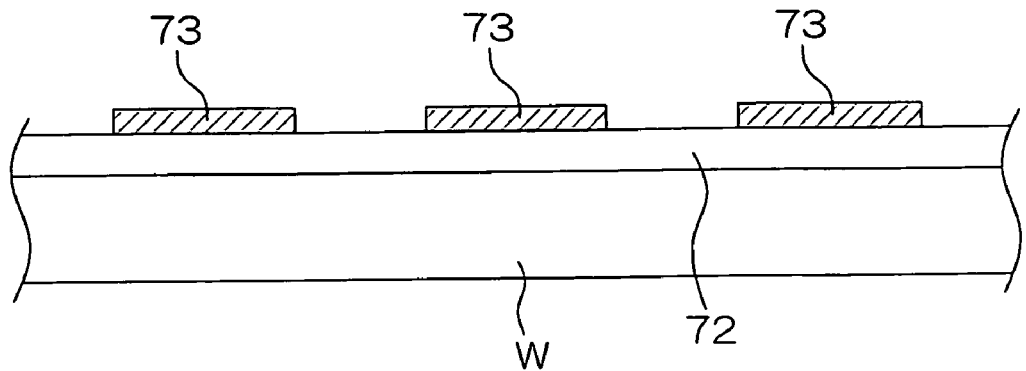
FIGS. 20(a), 20(b) and 20(c) are schematic sectional views for explaining the production method for the semiconductor device shown in FIG. 19.

First, an active layer 72 including a functional device and interconnections is formed in one surface of a preliminarily planarized semiconductor wafer W, and electrode pads 73 are formed at predetermined positions on the active layer 72. This state is shown in FIG. 20(a). Thereafter, a passivation film (not shown) is formed on the resulting wafer W so as to expose the electrode pads 73.

In turn, a stopper mask layer 74 of a metal such as chromium is formed on the entire surface of the resulting wafer W on the side of the active layer 72 by chemical vapor deposition. The formation of the stopper mask layer 74 by the chemical vapor deposition obviates the need for a barrier metal layer. However, the barrier metal layer may be formed for the formation of the stopper mask layer 74 by electrolytic plating. The electrolytic plating ensures that the stopper mask layer 74 is properly formed as having a great thickness.

Figure 20B:
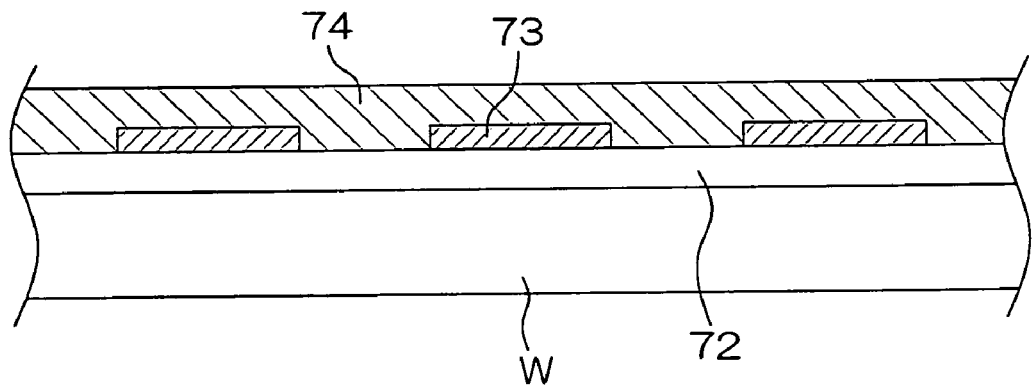

If the resulting stopper mask layer 74 has an uneven thickness or has a poor surface planarity, the surface of the stopper mask layer 74 is planarized to an even thickness by CMP (see FIG. 20(b)).

Figure 20C:
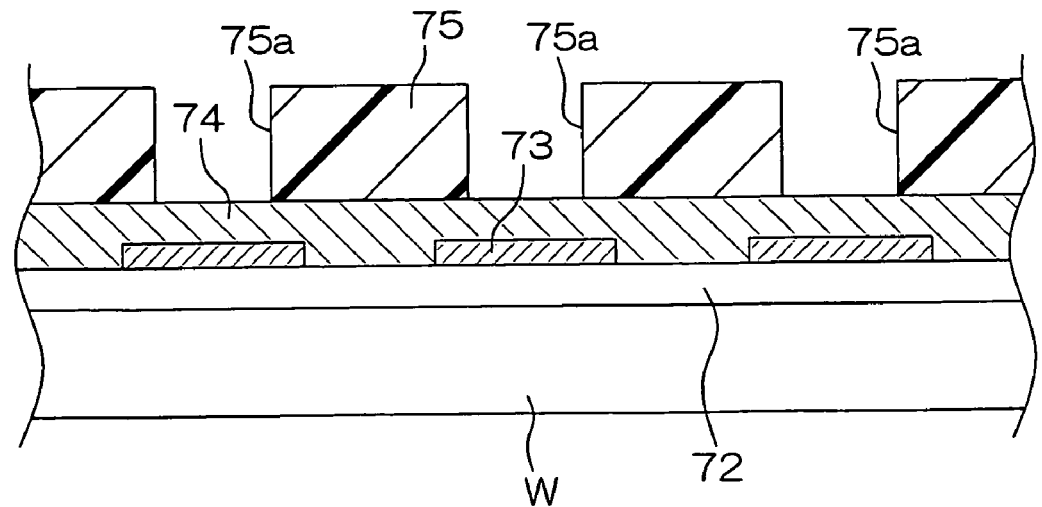

Subsequently, a resist film (photoresist) 75 is formed over the stopper mask layer 74, and apertures 75a for etching are formed in the resist film 75 by removing portions of the resist film 75 located above the electrode pads 73 by photolithography. The etching apertures 75a each have a width which is smaller than the width of the electrode pads 73. This state is shown in FIG. 20(c).

Figure 21D:
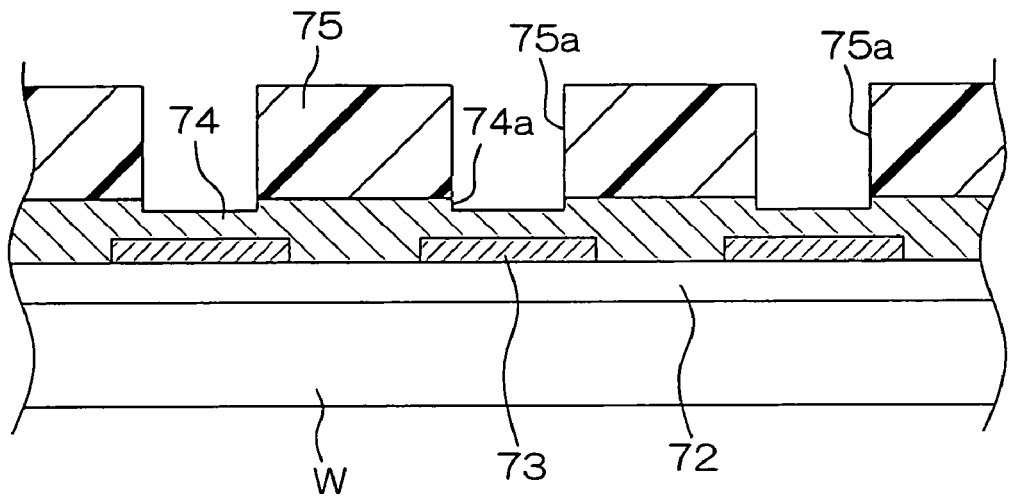
FIGS. 21(d), 21(e) and 21(f) are schematic sectional views for explaining the production method for the semiconductor device shown in FIG. 19.

Thereafter, the stopper mask layer 74 is shallowly dry-etched or wet-etched through the etching apertures 75a of the resist film 75. Thus, the stopper mask layer 74 is formed with recesses 74a which are respectively continuous to the etching apertures 75a of the resist film 75. This state is shown in FIG. 21(d).

Figure 21E:
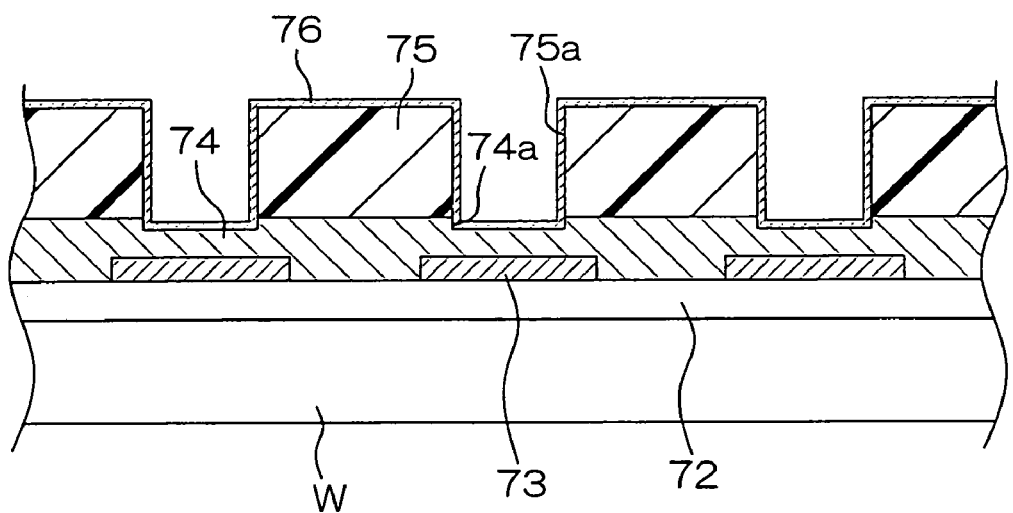
Figure 21F:
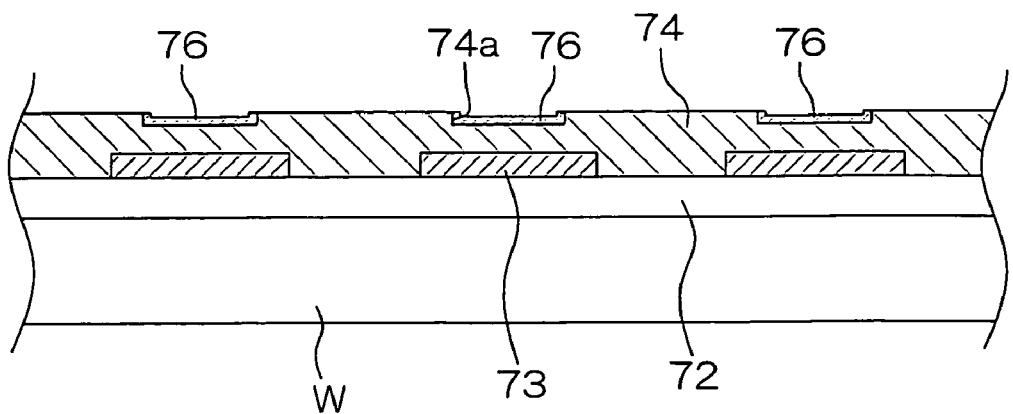

In this state (i.e., in the presence of the resist film 75), a low melting point metal layer 76 of a low melting point metal is formed on a surface of the resulting wafer W on the side of the active layer 72 by chemical vapor deposition or sputtering. Thus, the low melting point metal layer 76 is provided on the top of the resist film 75, on the interior side walls of the etching apertures 75a and on the interior side walls and bottom surfaces of the recesses 74a as shown in FIG. 21(e).

Subsequently, the resist film 75 and a portion of the low melting point metal layer 76 present outside the recesses 74a are removed by polishing (grinding) the surface of the wafer W formed with the resist film 75. Thus, the low melting point metal layer 76 is left only in the recesses 74a, i.e., above the electrode pads 73 (see FIG. 21(f)).

Where virtually no low-melting point metal is deposited on the interior side walls of the etching apertures 75a of the resist film 75, the resist film 75 can be removed only by the etching without the polishing of the resist film 75. That is, where the interior side walls of the etching apertures 75a are exposed, the resist film 75 can be etched away from the exposed portions thereof. This process also makes it possible to leave the low melting point metal layer 76 only above the electrode pads 73 (see FIG. 21(f)).

Since the resist film 75 of a resin has a lower friction resistance than the stopper mask layer 74 of the metal, virtually only the resist film 75 and the portion of the low melting point metal layer 76 present outside the recesses 74a can selectively be removed.

In turn, a portion of the stopper mask layer 74 is removed by etching by utilizing the low melting point metal layer portions 76 left in the recesses 74a as a mask. Remaining portions of the stopper mask layer 74 serve as projection electrodes 77, which project from the surface of the wafer W (electrode pads 73). In this step, the etching is carried out so that the etching rate of the stopper mask layer 74 is higher than the etching rate of the low melting point metal layer 76.

Thereafter, the wafer W is diced into pieces of the semiconductor substrate 78. Thus, the semiconductor device 70 shown in FIG. 19 is provided.

This production method utilizes the stopper mask layer 74 for the formation of the low melting point metal layer portions 76 at the predetermined positions on the wafer W unlike the production methods according to the first to fourth embodiments which utilize the stopper mask layer 4, 24, 44, 64 for the formation of the projection electrodes 7, 27, 47, 67 at the predetermined positions on the wafer W. In the first to fourth embodiments, the stopper mask layer 4, 24, 44, 64 is utilized for removing the unnecessary portions of the separately formed metal layer 6, 26, 46, 66 for the formation of the projection electrodes 7, 27, 47, 67. In the production method according to this embodiment, on the other hand, the low melting point metal layer portions 76 are utilized for removing the unnecessary portions of the stopper mask layer 74 for the formation of the projection electrodes 77.

Thus, the stopper mask layer 74 per se is processed to provide the projection electrodes 77 in the production method according to this embodiment. This obviates the need for separately forming the metal film 6, 26, 46, 66, thereby simplifying the process.

As described above, the semiconductor device 70 having the same construction as the semiconductor device 15 (see FIG. 4) produced by the production method (see FIGS. 2(*a*) to 2(*c*), FIGS. 3(*d*) to 3(*f*) and FIGS. 5(*g*) to 5(*i*)) according to the modification of the first embodiment can be produced by the production method according to this embodiment, though there is a significant difference between these production methods. Either of these production methods may be selected according to the materials for the projection electrodes 7, 77 and the low melting point metal layers 16, 76.

Figure 22:
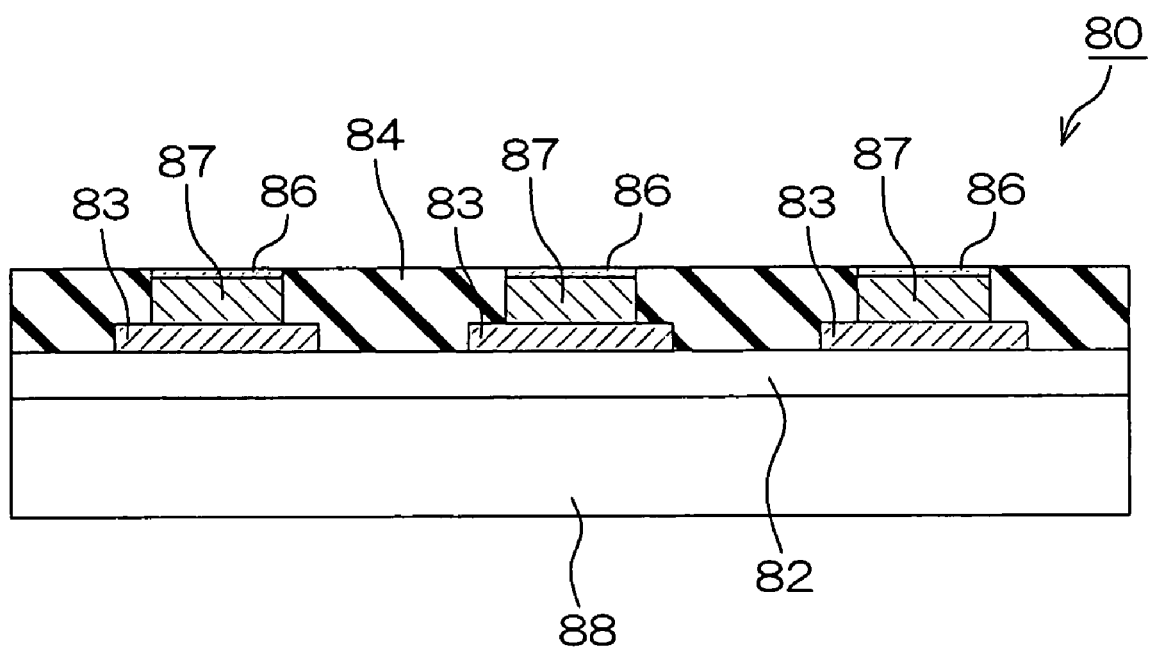
FIG. 22 is a schematic sectional view of a semiconductor device produced by a production method according to a sixth embodiment of the present invention.

FIG. 22 is a schematic sectional view of a semiconductor device produced by a production method according to a sixth embodiment of the present invention.

The semiconductor device 80 includes a semiconductor substrate 88 not packaged, and is capable of so-called flip-chip connection. An active layer 82 including a functional device and interconnections is provided in one surface of the semiconductor substrate 88, and electrode pads and interconnections (hereinafter referred to generally as "electrode pads") 83 electrically connected to the functional device in the active layer 82 are provided at predetermined positions on the active layer 82. A passivation film (not shown) for protecting the active layer 82 is provided on the active layer 82 with the electrode pads 83 exposed therefrom.

Column-shaped projection electrodes 87 are respectively bonded to the electrode pads 83. Thin layers 86 of a low melting point metal such as tin, indium or an alloy of tin or indium are provided on distal end faces of the projection electrodes 87. A stopper mask layer 84 of a thermoplastic resin or a low softening point (low melting point) glass is provided on the active layer 82. The surface of the stopper mask layer 84 and the surfaces of the low melting point metal layers 86 are generally flush with each other. That is, neither the projection electrodes 87 nor the low melting point metal layers 86 project from the surface of the stopper mask layer 84.

The semiconductor device 80 can be connected to a wiring board with the projection electrodes 87 thereof being bonded to electrode pads provided on the wiring board for flip-chip connection by melting and solidifying the low melting point metal layers 86. At this time, a space between the semiconductor substrate 88 and the wiring board is generally occupied by the stopper mask layer 84, because neither the projection electrodes 87 nor the low melting point metal layers 86 project from the surface of the stopper mask layer 84.

If the semiconductor device 80 is heated at a temperature not lower than the glass transition temperature (or softening point) of the stopper mask layer 84 for melting the low melting point metal layers 86, the stopper mask layer 84 is easily deformed and fluidized. Therefore, the space between the semiconductor substrate 88 and the wiring board is filled with the stopper mask layer 84 with no clearance. Thus, the stopper mask layer 84 functions as an under-fill material.

The stopper mask layer 84 may have a two-layer (multi-layer) structure which includes an insulative material layer of an oxide, a nitride or a high elastic modulus resin provided adjacent the semiconductor substrate 88 and an adhesive resin layer such as of a thermoplastic resin provided away from the semiconductor substrate 88. In this case, the insulative material layer preferably has a greater thickness, and the adhesive resin layer preferably has a smaller thickness. Since the thermoplastic resin is generally inferior in insulative property, the insulative material layer having a greater thickness can improve the insulative property of the entire stopper mask layer 84.

Such semiconductor devices 80 having the same construction can be connected to each other for so-called chip-on-chip connection with the active layer sides thereof opposed to each other and with the corresponding low melting point metal layers 86 thereof bonded to each other.

In this case, it is preferred that the low melting point metal layers 86 provided on the distal end faces of the projection electrodes 87 of one of the semiconductor devices 80 each have a surface generally flush with or slightly recessed with respect to the surface of the stopper mask layer 84, and the distal end faces of the projection electrodes 87 of the other semiconductor device 80 each have a slightly projecting surface with respect to the surface of the stopper mask layer 84.

Alternatively, the projection electrodes 87 of one of the semiconductor devices 80 may be formed with no low melting point metal layer 86, and each have a surface generally flush with or slightly recessed with respect to the surface of the stopper mask layer 84. In this case, the projection electrodes 87 of the other semiconductor device 80 may respectively have the low melting point metal layers 86 provided on the distal end faces thereof, and slightly project from the surface of the stopper mask layer 84.

In such cases, the semiconductor devices 80 can easily be bonded to each other, while a space between these semiconductor devices 80 can be filled with the stopper mask layers 84.

Where the semiconductor devices 80 having the same construction are connected to each other for chip-on-chip connection with the active regions thereof opposed to each other, cross-talk may occur between the interconnections formed in the active regions thereof. The thermoplastic resin generally has a high dielectric constant and, hence, is not suitable for suppression of the cross-talk. Therefore, the stopper mask layer 84 having the two-layer (multi-layer) structure including the insulative material layer and the adhesive resin layer as described above is employed, and the thickness of the insulative material layer having a lower dielectric coefficient is increased for the suppression of the cross-talk. Alternatively, the suppression of the cross-talk may be achieved by increasing the distance between the opposed semiconductor devices 80. However, where the insulative material layer having a smaller elastic modulus and a smaller linear expansion coefficient than the adhesive resin layer has an increased thickness, a stress occurring in the junctions due to thermal expansion and contraction can be reduced, thereby improving the reliability.

Figure 23A:
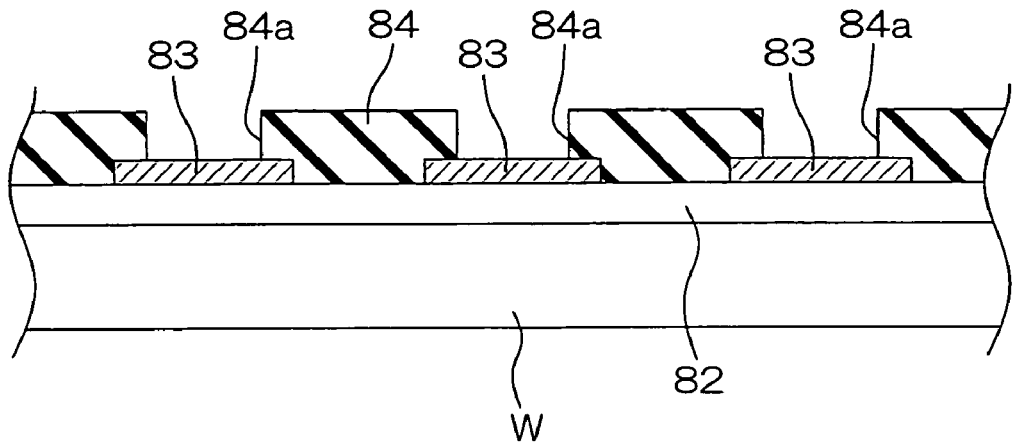
FIGS. 23(a), 23(b) and 23(c) are schematic sectional views for explaining the production method for the semiconductor device shown in FIG. 22.
Figure 23B:
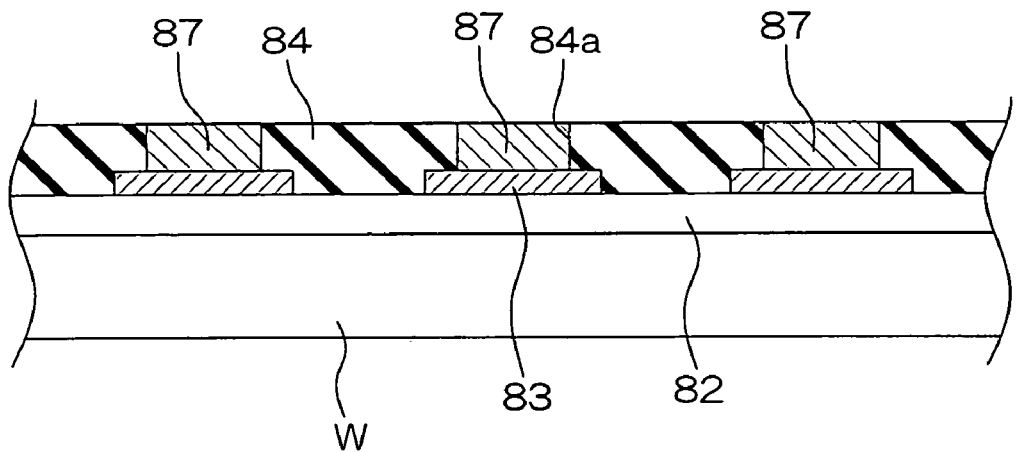
Figure 23C:
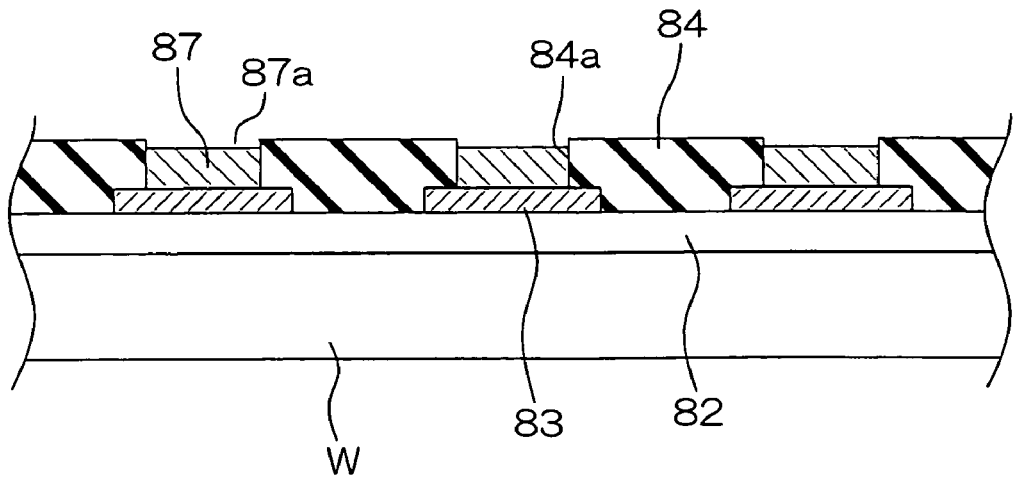

FIGS. 23(*a*), 23(*b*) and 23(*c*) are schematic sectional views for explaining the production method for the semiconductor device 80 shown in FIG. 22.

First, an active layer 82 including a functional device and interconnections is formed in one surface of a preliminarily planarized wafer W, and electrode pads 83 are formed at predetermined positions on the active layer 82. Thereafter, a passivation film (not shown) is formed on the resulting wafer W so as to expose the electrode pads 83.

In turn, a stopper mask layer 84 of a thermoplastic resin or a low softening point glass is formed on the entire surface of the resulting wafer W on the side of the active layer 82. The stopper mask layer 84 is sufficiently high in elastic modulus and shear modulus at a room temperature than the resist film

105 employed in the conventional production method (see FIGS. 26(*b*) and 26(*c*)) and, hence, is less liable to be deformed when a force is exerted thereon.

Instead of the stopper mask layer 84 of the thermoplastic resin or the low softening point glass, an insulative material layer of an oxide, a nitride or a high elastic modulus resin may be formed on the wafer W, and an adhesive resin layer such as of a thermoplastic resin having an adhesive property may be formed on the insulative material layer. In this case, the stopper mask layer 84 is constituted by the insulative material layer and the adhesive resin layer.

If the resulting stopper mask layer 84 has an uneven thickness or a poor surface planarity, the surface of the stopper mask layer 84 is planarized to an even thickness by CMP.

Subsequently, portions of the stopper mask layer 84 above the electrode pads 83 are removed in the same manner as in the first to fourth embodiments by utilizing a resist film (photoresist), whereby the stopper mask layer 84 is formed with openings 84a. The openings 84a each have a width, for example, which is smaller than the width of the electrode pads 83 and greater than the width of portions of the electrode pads 83 exposed from the passivation film (not shown). However, the width of the openings 84a is not limited to that defined above. This state is shown in FIG. 23(*a*).

In turn, projection electrodes 87 (metal films) are formed in the openings 84a in the same manner as in the first and second embodiments. At this time, a continuous and flat surface is defined by the surface of the stopper mask layer 84 and the surfaces of the projection electrodes 87 formed by the polishing (grinding) by the CMP. This state is shown in FIG. 23(*b*).

Where the stopper mask layer 84 has a two-layer (multilayer) structure including the insulative material layer and the adhesive resin layer, and the insulative material layer having a high elastic modulus has a greater thickness than the adhesive resin layer, the projection electrodes 87 can be shaped in conformity with the initial shape of the openings 84a. Therefore, short-circuit between the projection electrodes 87 can be prevented for improvement of the reliability.

Thereafter, the projection electrodes 87 are partly etched by a predetermined thickness, whereby recesses 87a are formed above the projection electrodes 87 (see FIG. 23(*c*)). Then, a low melting point metal layer 86 of a low melting point metal such as tin, indium or an alloy of tin or indium is formed over the distal end faces of the projection electrodes 87 in the same manner as in the production methods according to the modifications of the first to third embodiments. A portion of the low melting point metal layer 86 present outside the recesses 87a is removed by CMP, so that the low melting point metal layer 86 is left only within the recesses 87a.

Thereafter, the wafer W is diced into pieces of the semiconductor substrate 88 with the stopper mask layer 84 left thereon. Thus, the semiconductor device 80 shown in FIG. 22 is provided.

A semiconductor device having recesses above the projection electrodes 87 (low melting point metal layers 86) is produced by forming low melting point metal layers 86 in the recesses 87a so as not to completely fill the recesses 87a with the low melting point metal layers 86, then removing portions of the low melting point metal layers 86 present outside the recesses 87a, and dicing the wafer W into semiconductor substrate pieces. Alternatively, the semiconductor device of the same construction may be produced by forming low melting point metal layers 86 only on the distal end faces of the projection electrodes 87 by electroless plating after the formation of the recesses 87a, and dicing the wafer W into semiconductor substrate pieces.

The projecting projection electrodes 87 of the semiconductor device 80 shown in FIG. 22 are fitted in the recesses of the projection electrodes of the semiconductor device thus produced for chip-on-chip connection of these semiconductor devices. In this case, a space between the semiconductor devices is generally filled with the stopper mask layers 84 of the semiconductor devices.

Figure 24:
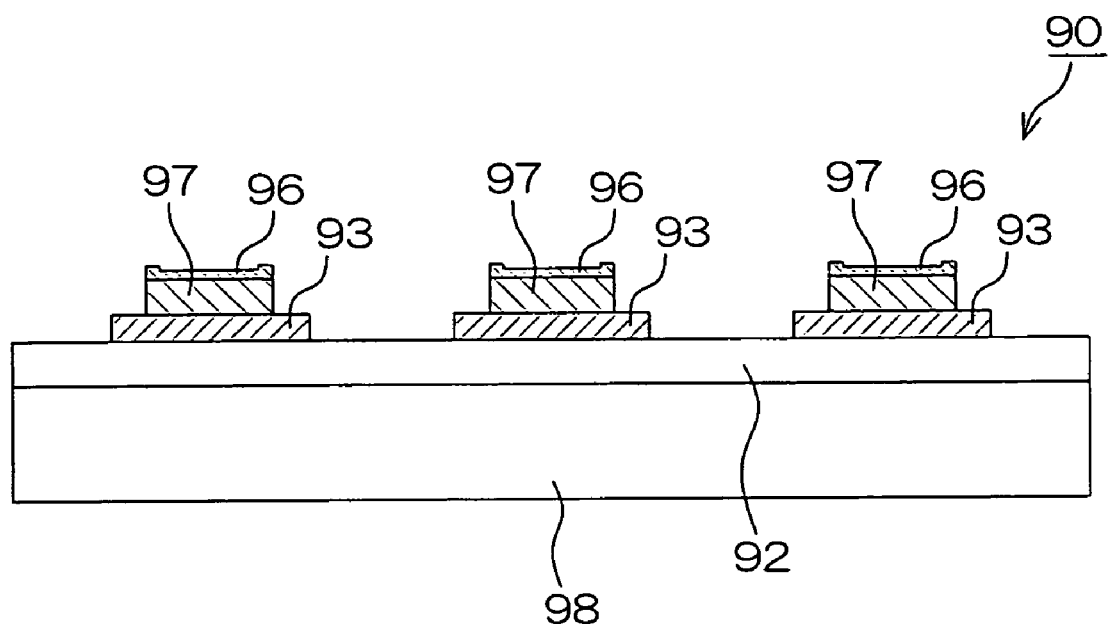
FIG. 24 is a schematic sectional view of a semiconductor device produced by a production method according to a seventh embodiment of the present invention.

FIG. 24 is a schematic sectional view of a semiconductor device produced by a production method according to a seventh embodiment of the present invention.

The semiconductor device 90 includes a semiconductor substrate 98 not packaged, and is capable of so-called flip-chip connection. An active layer 92 including a functional device and interconnections is provided in one surface of the semiconductor substrate 98, and electrode pads and interconnections (hereinafter referred to generally as "electrode pads") 93 electrically connected to the functional device in the active layer 92 are provided at predetermined positions on the active layer 92. A passivation film (not shown) for protecting the active layer 92 is provided on the active layer 92 with the electrode pads 93 exposed therefrom.

Column-shaped projection electrodes 97 respectively project from the electrode pads 93. The projection electrodes 97 are composed of a cured electrically conductive thermosetting paste. Thin layers 96 of a low melting point metal such as tin, indium or an alloy of tin or indium are provided on distal end faces of the projection electrodes 97.

The semiconductor device 90 can be connected to a wiring board with the projection electrodes 97 thereof being bonded to electrode pads provided on the wiring board for flip-chip connection by melting and solidifying the low melting point metal layers 96. The low melting point metal layers 96 are not necessarily required to be provided on the distal end faces of the projection electrodes 97. In this case, the projection electrodes 97 may be bonded directly to the electrode pads and the like provided on the wiring board.

FIGS. 25(*a*), 25(*b*), 25(*c*) and 25(*d*) are schematic sectional views for explaining the production method for the semiconductor device 90 shown in FIG. 24.

First, an active layer 92 including a functional device and interconnections is formed in one surface of a preliminarily planarized wafer W, and electrode pads 93 are formed at predetermined positions on the active layer 92. Thereafter, a passivation film (not shown) is formed on the resulting wafer W so as to expose the electrode pads 93.

In turn, a stopper mask layer 94 is formed on the entire surface of the resulting wafer W on the side of the active layer 92. The stopper mask layer 94 may be composed of a material having a solvent resistance, for example, a metal such as chromium or aluminum, an insulative material such as silicon oxide or a resin. The material for the stopper mask layer 94 has a higher elastic modulus and a higher shear modulus, so that the stopper mask layer 94 is less liable to be deformed when a force is exerted thereon.

If the resulting stopper mask layer 94 has an uneven thickness or a poor surface planarity, the surface of the stopper mask layer 94 is planarized to an even thickness by CMP.

Figure 25A:
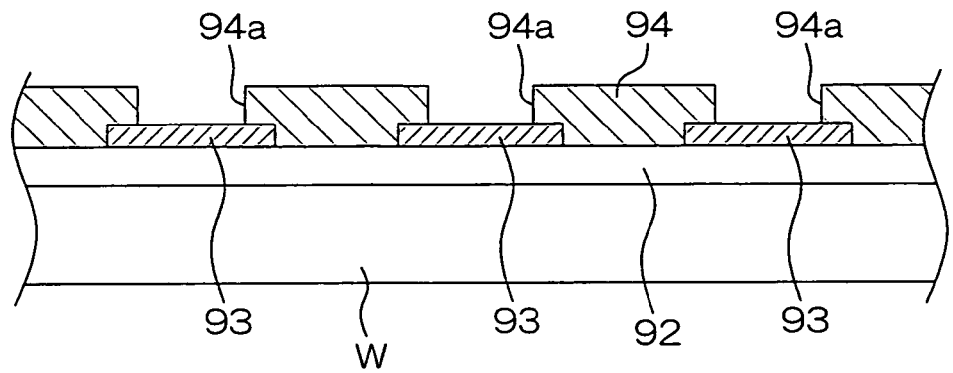
FIGS. 25(a), 25(b), 25(c) and 25(d) are schematic sectional views for explaining the production method for the semiconductor device shown in FIG. 24.

Subsequently, portions of the stopper mask layer 94 above the electrode pads 93 are removed in the same manner as in the first to fourth embodiments by utilizing a resist film (photoresist), whereby the stopper mask layer 94 is formed with openings 94a. The openings 94a each have a width, for example, which is smaller than the width of the electrode pads 93 and greater than the width of portions of the electrode pads 93 exposed from the passivation film (not shown). However, the width of the openings 94a is not limited to that defined above. After the formation of the openings 94a, the resist film is removed. This state is shown in FIG. 25(a).

Figure 25B:
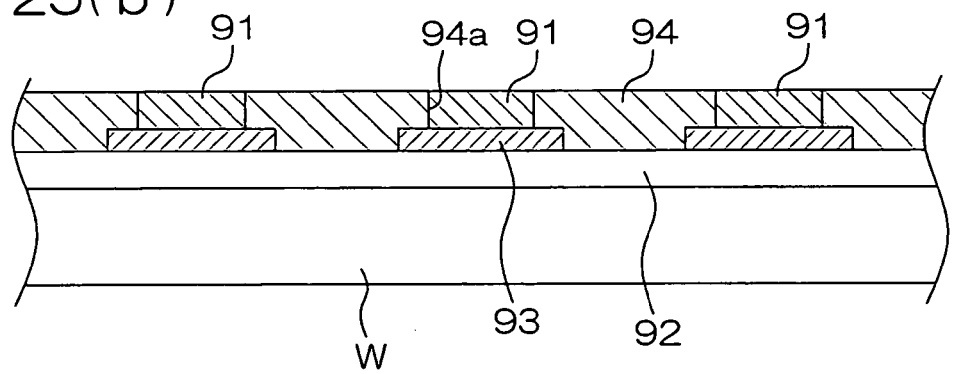
Figure 25C:
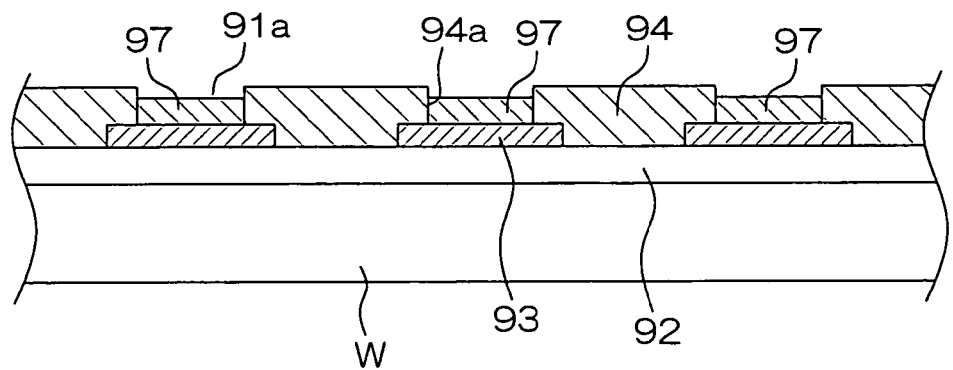

In turn, the openings 94a are filled with an electrically conductive thermosetting paste 91, and a portion of the electrically conductive paste 91 applied outside the openings 94a is removed by means of a squeegee which is generally employed for screen printing. Thus, the surface of the stopper mask layer 94 and the surfaces of the resulting conductive paste layers 91 are flush with each other. This state is shown in FIG. 25(b).

Where the conductive paste 91 has a sufficiently low viscosity, this step may be achieved by spin coating. In either case, a solvent contained in the conductive paste 91 does not deteriorate nor solve the stopper mask layer 94 which has a solvent resistance.

Thereafter, the resulting wafer W is heated, whereby the conductive paste layers 91 are cured to provide projection electrodes 97. At this time, recesses 91a are formed above the projection electrodes 97 by the contraction of the cured conductive paste layers 91 with evaporation of the solvent (see FIG. 25(c)). Since the stopper mask layer 94 is sufficiently high in elastic modulus and shear modulus, the openings 94a do not deform due to the contraction of the cured conductive paste layers 91. Therefore, the projection electrodes 97 have side faces conformal to the initial shape of the opening 94a.

Figure 25D:
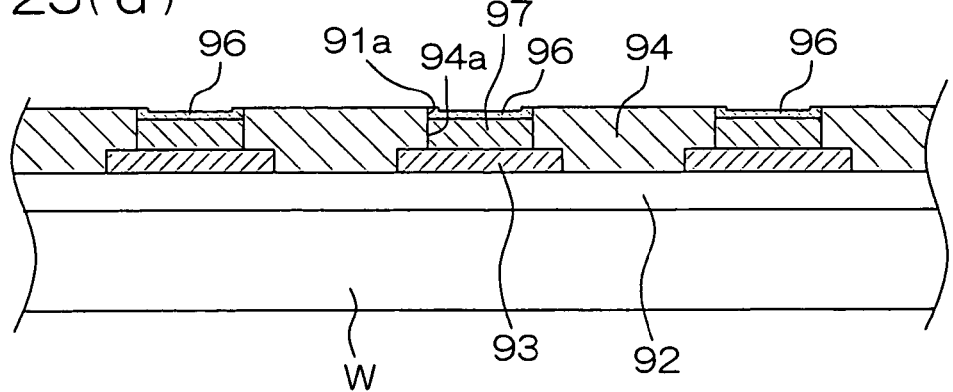

Then, a low melting point metal layer 96 of a low melting point metal such as tin, indium or an alloy of tin or indium is formed over the distal end faces of the projection electrodes 97 in the same manner as in the production methods according to the modifications of the first to third embodiments. Alternatively, the formation of the low melting point metal layer 96 may be achieved by applying an electrically conductive thermosetting paste containing the low melting point metal and curing the paste. A portion of the low melting point metal layer 96 present outside the recesses 91a is removed by CMP, so that the low melting point metal layer 96 is left only within the recesses 91a. This state is shown in FIG. 25(d).

Thereafter, the stopper mask layer 94 is etched away, whereby the projection electrodes 97 project from the surface of the wafer W (electrode pads 93). Then, the wafer W is diced into pieces of the semiconductor substrate 98. Thus, the semiconductor device 90 shown in FIG. 24 is provided.

Where the stopper mask layer 94 is composed of the insulative material, the stopper mask layer 94 may partly be removed by a predetermined thickness after the formation of the low melting point metal layers 96. In this case, a remaining portion of the stopper mask layer 94 serves as a protective film.

In this production method, the recesses 91a can easily be formed simply by heating the wafer W to cure the conductive paste 91. Thus, the low melting point metal layers 96 can easily be formed on the distal end faces of the projection electrodes 97 (cured conductive paste layers).

While the embodiments of the present invention have thus been described, the materials for the projection electrodes 7, 27, 47, 67, 77, 87, 97 (metal films 6, 26, 46, 66) and the stopper mask layers 4, 24, 44, 64, 74, 84, 94, the methods for the formation of the metal films 6, 26, 46, 66, and the options of the formation of the barrier metal layers 41, 61, the formation of the diffusion prevention film 69, and the formation of the low melting point metal layers may be employed in any combination in the present invention.

While the present invention has been described in detail by way of the embodiment thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2002-338480 filed with the Japanese Patent Office on Nov. 21, 2002, the disclosure thereof being incorporated herein by reference.

What is claimed is:

1. A semiconductor device comprising:
    an active layer provided in one surface of a semiconductor substrate;
    a projection electrode of a metal electrically connected to the active layer, the projection electrode having a flat top surface and a generally uniform width throughout a length direction thereof from the active layer to a distal end of the projection electrode, and extending generally perpendicularly to the semiconductor substrate;
    a protective film provided over the active layer with at least a proximal half portion of the projection electrode being embedded therein and with a distal portion of the projection electrode being exposed therefrom, the protective film comprising an oxide with an elastic modulus of at least 1.5 GPa;
    a device electrode pad, the projection electrode and the active layer being electrically connected via the device electrode pad; and
    a seed layer provided only between the device electrode pad and the projection electrode,
    wherein the semiconductor device is a completed device and is configured to be connected by flip-chip connection.

2. A semiconductor device as set forth in claim 1, further comprising a barrier metal layer provided between the projection electrode and the device electrode pad.

3. A semiconductor device as set forth in claim 2, further comprising a diffusion prevention film provided along a side face of said projection electrode, to prevent diffusion of a metal element across said barrier metal layer.

4. A semiconductor device as set forth in claim 1, wherein the semiconductor device is connected to another semiconductor device having another projection electrode provided in association with the projection electrode so as to form a chip-on-chip connection.

5. A semiconductor device as set forth in claim 1, wherein the semiconductor device is connected to a board electrode pad provided on a wiring board so as to form a flip-chip connection.

6. A semiconductor device as set forth in claim 1, wherein the distal portion of the projection electrode protrudes through an opening in the protective film.

7. A semiconductor device as set forth in claim 1, wherein the projection electrode comprises gold.

8. A semiconductor device comprising:
    an active layer provided in one surface of a semiconductor substrate;
    a projection electrode of a metal electrically connected to the active layer, the projection electrode having a generally uniform width throughout a length direction thereof from the active layer to a distal end of the projection electrode, and extending generally perpendicularly to the semiconductor substrate; and
    a protective film provided over the active layer with at least a proximal half portion of the projection electrode being embedded therein and with a distal portion of the projection electrode being exposed therefrom, the protective film comprising an oxide with an elastic modulus of at least 1.5 GPa;

wherein the semiconductor device is a completed device and is configured to be connected by flip-chip connection.

9. A semiconductor device as set forth in claim 8, further comprising a device electrode pad, the projection electrode and the active layer being electrically connected via the device electrode pad.

10. A semiconductor device as set forth in claim 9, further comprising a barrier metal layer provided between the projection electrode and the device electrode pad.

11. A semiconductor device as set forth in claim 10, further comprising a diffusion prevention film provided along a side face of said projection electrode, to prevent diffusion of a metal element across said barrier metal layer.

12. A semiconductor device as set forth in claim 8, wherein the semiconductor device is connected to another semiconductor device having another projection electrode provided in association with the projection electrode so as to form a chip-on-chip connection.

13. A semiconductor device as set forth in claim 9, wherein the semiconductor device is connected to a board electrode pad provided on a wiring board so as to form a flip-chip connection.

14. A semiconductor device as set forth in claim 8, wherein the distal portion of the projection electrode protrudes through an opening in the protective film.

15. A semiconductor device as set forth in claim 8, wherein the projection electrode comprises gold.

* * * * *